United States Patent
Itoh et al.

(10) Patent No.: US 6,929,903 B2
(45) Date of Patent: Aug. 16, 2005

(54) DEVELOPING METHOD, SUBSTRATE TREATING METHOD, AND SUBSTRATE TREATING APPARATUS

(75) Inventors: Masamitsu Itoh, Yokohama (JP); Ikuo Yoneda, Kawasaki (JP); Hideaki Sakurai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 78 days.

(21) Appl. No.: 10/653,611

(22) Filed: Aug. 28, 2003

(65) Prior Publication Data

US 2004/0106072 A1 Jun. 3, 2004

(30) Foreign Application Priority Data

Aug. 30, 2002 (JP) ........................................ 2002-252503

(51) Int. Cl.[7] ............................ G03F 7/30; G03D 15/00
(52) U.S. Cl. ...................... 430/329; 430/311; 430/319
(58) Field of Search ................................. 430/329, 311, 430/319

(56) References Cited

U.S. PATENT DOCUMENTS 6,550,990 B2    4/2003  Sakurai et al. ............... 396/604
2002/0121341 A1 * 9/2002  Tanaka et al. ......... 156/345.21

FOREIGN PATENT DOCUMENTS

JP     2002-252167     9/2002

* cited by examiner

*Primary Examiner*—Hoa Van Le
(74) *Attorney, Agent, or Firm*—Finnegan, Henderson, Farabow, Garrett & Dunner, L.L.P.

(57) ABSTRACT

A developing method comprises determining in advance the relation of resist dissolution concentration in a developing solution and resist dissolution speed by the developing solution, estimating in advance the resist dissolution concentration where the resist dissolution speed is a desired speed or more from the relation, and developing in a state in which the resist dissolution concentration in the developing solution is the estimated dissolution concentration or less.

10 Claims, 22 Drawing Sheets

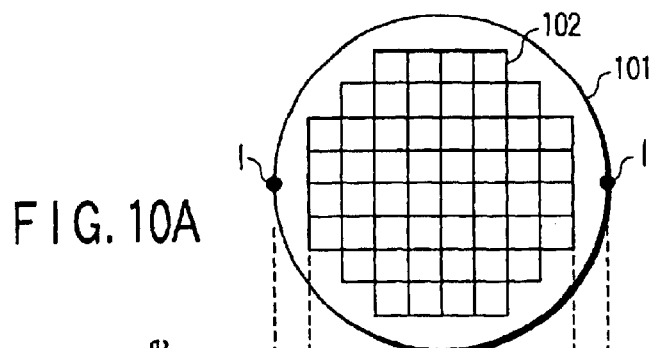
FIG. 10A
FIG. 10B
FIG. 10C
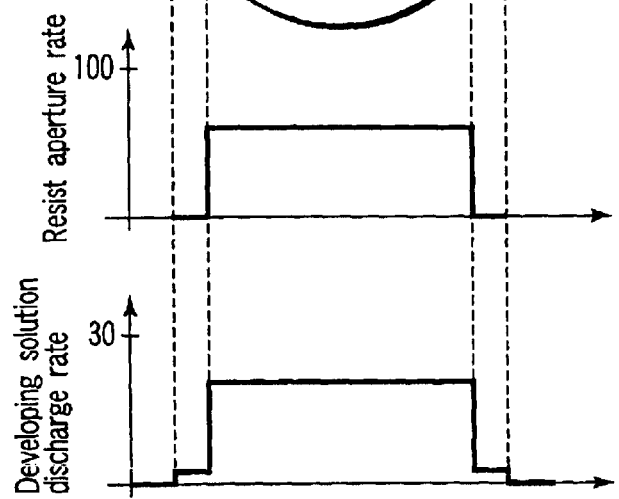
FIG. 11A
FIG. 11B
FIG. 11C

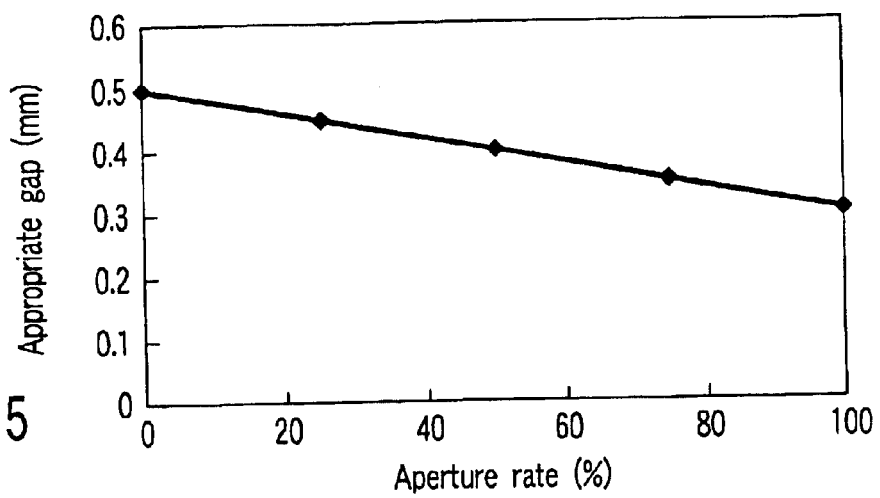
F I G. 15
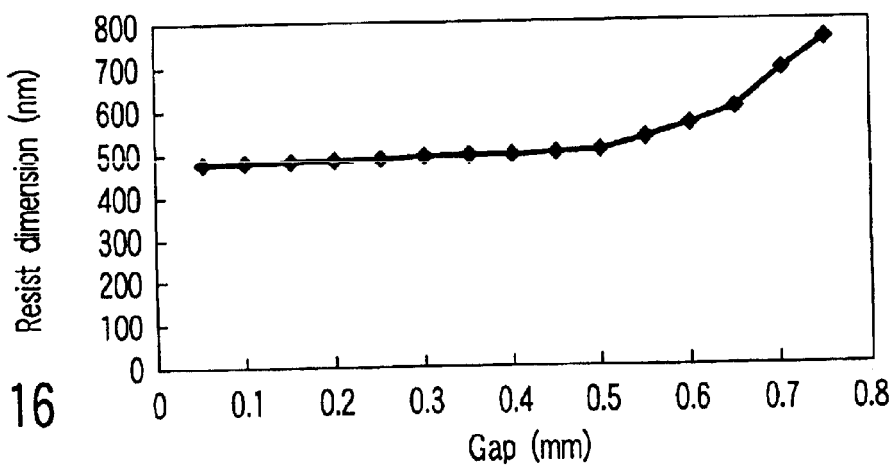
F I G. 16
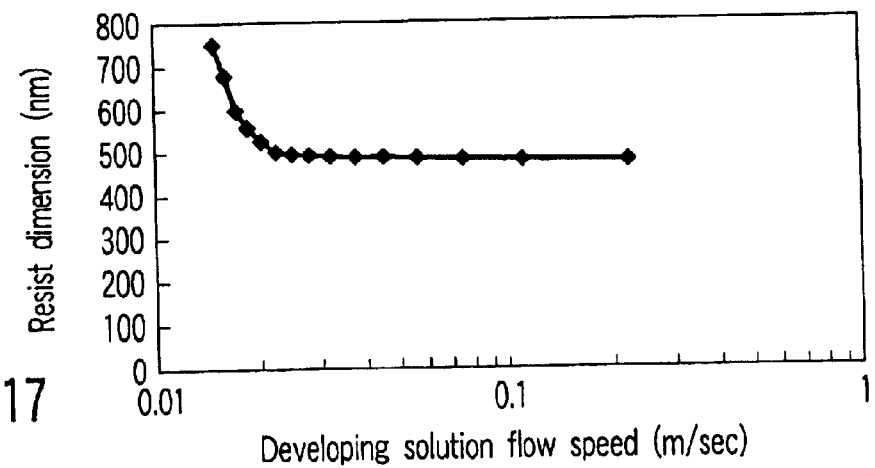
F I G. 17

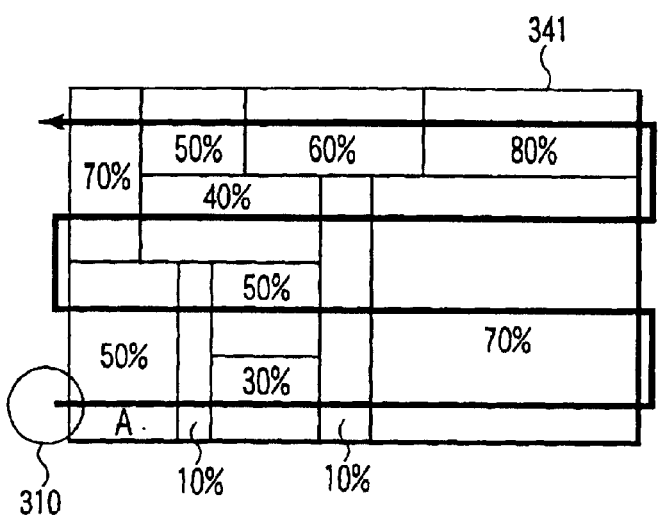
F I G. 34
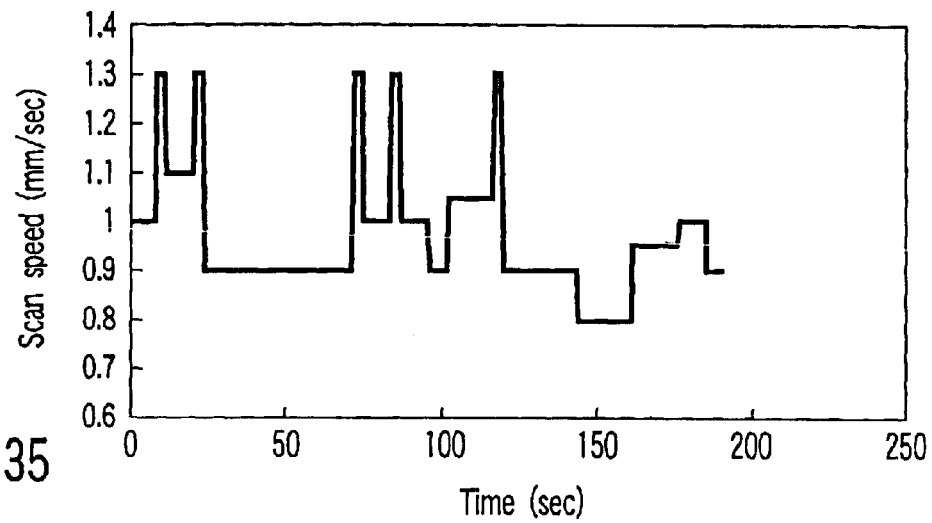
F I G. 35
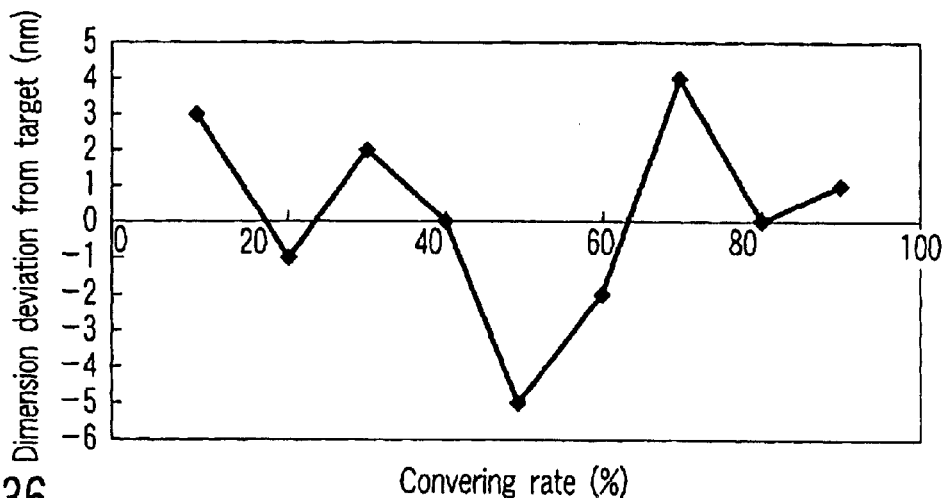
F I G. 36

DEVELOPING METHOD, SUBSTRATE TREATING METHOD, AND SUBSTRATE TREATING APPARATUS

CROSS-REFERENCE TO RELATED APPLICATIONS

This application is based upon and claims the benefit of priority from the prior Japanese Patent Application No. 2002-252503, filed Aug. 30, 2002, the entire contents of which are incorporated herein by reference.

BACKGROUND OF THE INVENTION

1. Field of the Invention

The present invention relates to a developing method for developing resist, a substrate treating method for treating a substrate surface with a solution, and a substrate treating apparatus.

2. Description of the Related Art

There is a mounting problem recently in the process of photolithography for use in semiconductor manufacturing process. As the semiconductor devices are miniaturized, there is an increasing demand for ultrafine dimensions in the process of photolithography. Already the design rule of device has been reduced to 0.13 $\mu$m, and the pattern dimension precision required to control is as severe as 10 nm. In this background, one of the factors impeding high precision in the pattern forming process is difference in the pattern finishing dimensions depending on the density of the pattern. For example, when line patterns of 130 nm in width are formed on a silicon wafer, the finishing dimension of line pattern of 130 nm differs depending on whether or not another large pattern is present around the line pattern.

This is because the line width of the pattern with same design dimension varies between the dense portion and the sparse portion of the pattern in the pattern forming process, in particular, developing process.

As mentioned herein, the problem is that the pattern finishing dimension differs depending on the pattern density.

BRIEF SUMMARY OF THE INVENTION (1) A developing method according to an aspect of the present invention comprises: determining in advance the relation of resist dissolution concentration in a developing solution and resist dissolution speed by the developing solution; estimating in advance the resist dissolution concentration where the resist dissolution speed is a desired speed or more from the relation; and developing in a state in which the resist dissolution concentration in the developing solution is the estimated dissolution concentration or less.

(2) A substrate treating method according to an aspect of the present invention comprises discharging a first solution continuously to a substrate to be treated from a first solution discharge port of a solution discharge/suction unit, sucking the solution on the substrate continuously from two suction ports disposed in the first solution discharge/suction unit so as to enclose the first solution discharge port, and treating the substrate surface with the solution while moving the first solution discharge/suction unit and the substrate relatively in a horizontal linear motion, wherein the volume of the first solution passing per unit time in a unit volume region contacting with the substrate is varied.

(3) A substrate treating method according to an aspect of the present invention comprises discharging a solution continuously to a substrate to be treated from a solution discharge port of a solution discharge/suction unit, sucking the solution on the substrate continuously from two suction ports disposed in the solution discharge/suction unit so as to enclose the solution-discharge port, and treating the substrate surface with the solution while moving the solution discharge/suction unit and the substrate relatively in a horizontal linear motion, wherein the flow speed of the solution flowing between the substrate and the solution discharge/suction unit is faster than the relative moving speed between the solution discharge/suction unit and the substrate.

(4) A substrate treating method according to an aspect of the present invention comprises discharging a solution continuously to a substrate to be treated from a solution discharge port of a solution discharge/suction unit, sucking the solution on the substrate continuously from two suction ports disposed in the solution discharge/suction unit so as to enclose the solution discharge port, and treating the substrate surface with the solution while moving the solution discharge/suction unit and the substrate relatively in a horizontal linear motion, wherein the interval between the substrate and the bottom of the solution discharge/suction unit is in a range of 0.01 mm or more and 0.5 mm or less.

(5) A substrate treating method according to an aspect of the present invention comprises discharging a solution continuously to a substrate to be treated from a solution discharge port of a solution discharge/suction unit, sucking the solution on the substrate continuously from two suction ports disposed in the solution discharge/suction unit so as to enclose the solution discharge port, and treating the substrate surface with the solution while moving the solution discharge/suction unit and the substrate relatively in a horizontal linear motion, wherein the average flow speed of the solution flowing between the substrate and the solution discharge/suction unit is 0.02 m/sec or more.

(6) A substrate treating method according to an aspect of the present invention comprises discharging a solution continuously to a substrate to be treated from a solution discharge port of a solution discharge/suction unit, sucking the solution on the substrate continuously from two suction ports disposed in the solution discharge/suction unit so as to enclose the solution discharge port, and treating the substrate surface with the solution while moving the solution discharge/suction unit and the substrate relatively in a horizontal linear motion, wherein the flow speed of the solution flowing between the substrate and the solution discharge/ suction unit is varied in terms of (7) A substrate treating method according to an aspect of the present invention comprises discharging a solution continuously to a substrate from a solution discharge port of a solution discharge/suction unit, sucking the solution on the substrate continuously from two suction ports disposed in the solution discharge/suction unit so as to enclose the solution discharge port, and treating the substrate surface with the solution while moving the solution discharge/ suction unit and the substrate relatively in a horizontal linear motion, wherein at least one of the relative moving speed between the substrate and the solution discharge/suction unit and the interval between the solution discharge/suction unit and the top of the substrate is varied in terms of time.

(8) A substrate treating method according to an aspect of the present invention comprises: discharging a first solution continuously to a substrate from a first solution discharge port disposed at the bottom a first solution discharge/suction unit, sucking the solution on the substrate continuously from two suction ports disposed at the bottom the first solution discharge/suction unit so as to enclose the solution discharge port, and treating the substrate surface with the first solution while moving the first solution discharge/suction unit and the substrate relatively in a horizontal linear motion; and discharging a second solution different from the first solution continuously to the substrate from a second solution discharge port disposed at the bottom a second solution discharge/suction unit different from the first solution discharge/suction unit, sucking the solution on the substrate continuously from two suction ports disposed at the bottom the second solution discharge/suction unit so as to enclose the solution discharge port, and treating the substrate surface with the second solution while moving the second solution discharge/suction unit and the substrate relatively in a horizontal linear motion.

(9) A substrate treating method according to an aspect of the present invention, comprises discharging a first solution continuously to a substrate from a solution discharge port of a solution discharge/suction unit, sucking the solution on the surface to be treated continuously from solution suction ports disposed in the solution discharge/suction unit so as to enclose the solution discharge port continuously, moving the solution discharge/suction unit and the substrate relatively, and treating with the solution by adjusting the suction pressure such that the solution does not flow out to the outside of the solution suction port, the method further comprising: acquiring in advance the relation between the covering rate of a pattern which is not removed by the first solution in the treating region where the first solution flow exists on the substrate, the relative speed of the solution discharge/suction unit and the substrate, and the finishing dimension of the pattern after the solution treatment; determining the relative speed of the solution discharge/suction unit and the substrate depending on the pattern covering rate on the basis of the relation; and treating with the solution while relatively moving the solution discharge/suction unit and the substrate depending on the determined relative speed and the pattern covering rate in the treating region.

(10) A substrate treating method according to an aspect of the present invention comprises discharging a first solution continuously to a substrate from a solution discharge port of a solution discharge/suction unit, sucking the solution on the surface to be treated continuously from solution suction ports in the solution discharge/suction unit, moving the solution discharge/suction unit and the substrate relatively, with the solution suction ports disposed to surround the solution discharge port, and adjusting the suction pressure such that the first solution does not flow out to the outside of the solution suction port, the method further comprising: acquiring in advance the relation between the covering rate of a pattern which is not removed by the first solution in the treating region where the first solution flow exists on the substrate, the flow speed of the first solution flowing between the solution discharge/suction unit and the substrate, and the finishing dimension of the pattern after the solution treatment; determining the flow speed of the first solution depending on the pattern covering rate on the basis of the relation; and treating with the solution while varying the flow speed of the first solution depending on the determined flow speed and the pattern covering rate in the treating region.

(11) A substrate treating apparatus according to an aspect of the present invention comprises: a substrate holding mechanism which holds a substrate; a solution discharge/ suction unit including a solution discharge port for discharging a first solution to the substrate held by the substrate holding mechanism, and suction ports for sucking the solution on the substrate, the suction ports being disposed to surround continuously the periphery of the solution discharge port; a moving mechanism which removes the substrate and the solution discharge/suction unit relatively; a solution discharge/suction system which simultaneously performs supplying a solution to the solution discharge/ suction mechanism and sucking the solution from the solution discharge/suction mechanism; a covering rate calculating unit which calculates the covering rate of a pattern treated by a first solution in a treating region where the first solution flow exists on the substrate; and a control unit which controls the moving mechanism depending on the relative speed determined from the relation between the covering rate of the pattern treated by the first solution in the treating region where the first solution flow exists on the substrate, the relative speed of the solution discharge/suction unit and the substrate, and the finishing dimension of the pattern after the solution treatment, and the pattern covering rate calculated by the covering rate calculating unit.

(12) A substrate treating apparatus according to an aspect of the present invention comprises: a substrate holding mechanism which holds a substrate; a solution discharge/ suction unit including a solution discharge port for discharging a first solution to the substrate held by the substrate holding mechanism, and suction ports for sucking the solution on the substrate, the suction ports being disposed to surround continuously the periphery of the solution discharge port; a moving mechanism which removes the substrate and the solution discharge/suction unit relatively; an interval adjusting unit which adjusts the interval between the top of the substrate and the solution discharge/suction unit; a solution discharge/suction system which simultaneously performs supplying a solution to the solution discharge/ suction mechanism and sucking the solution from the solution discharge/suction mechanism; a covering rate calculating unit which calculates the covering rate of a pattern treated by a first solution in a treating region where the first solution flow exists on the substrate; and a control unit which controls at least one of the solution discharge/suction system and the interval adjusting unit, depending on the flow speed of the first solution relative to the pattern covering rate determined from the relation between the covering rate of the pattern treated by the first solution in the treating region where the first solution flow exists on the substrate, the flow speed of the first solution flowing between the solution discharge/suction unit and the substrate, and the finishing dimension of the pattern after the solution treatment, and the pattern covering rate calculated by the covering rate calculating unit.

BRIEF DESCRIPTION OF THE SEVERAL VIEWS OF THE DRAWING

FIGS. 10A to 10C are diagrams showing a resist aperture rate distribution and a developing solution discharge rate set value.

FIGS. 11A to 11C are diagrams showing the resist aperture rate distribution and developing solution discharge rate set value.

FIG. 15 is a diagram showing the relation between an average aperture rate after development of a 5 mm square region in positive type resist, and a gap between a nozzle and a substrate for finishing to a desired resist dimension.

FIG. 16 is a diagram showing the relation between the gap between the nozzle and the substrate surface, and the resist dimension after development.

FIG. 17 is a diagram showing the relation between an average flow speed of developing solution flowing in the gap between the nozzle and the substrate, and the resist dimension after development.

FIG. 34 is a plan view showing a track of a developing nozzle according to the eighth embodiment.

FIG. 35 is a diagram showing the relation between treating time and scan speed according to the eighth embodiment.

FIG. 36 is a diagram showing the relation between a deviation amount from a target value of the formed pattern and the covering rate according to the eighth embodiment.

DETAILED DESCRIPTION OF THE INVENTION

Figure 1:
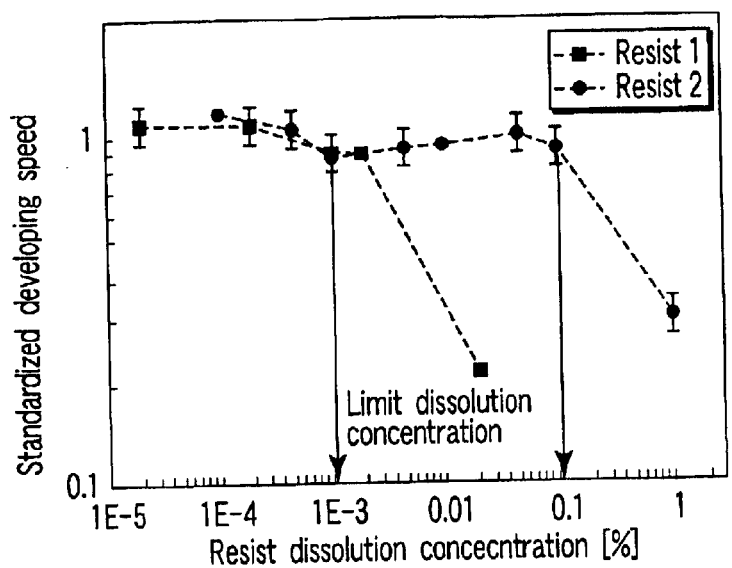
FIG. 1 is a diagram showing the relation between resist dissolution concentration and developing speed according to a first embodiment of the invention.

Referring now to the drawings, embodiments of the invention are described in detail below.

First Embodiment

First of all, changes of a developing speed (dissolving speed) when resist is dissolved in developing solution was experimented at various resist dissolution concentrations. The developing solution used in the experiment was 2.38% TMAH. Results of the experiment are shown in FIG. 1. FIG. 1 is a diagram showing the relation between resist dissolution concentration and developing speed according to a first embodiment of the invention.

FIG. 1 is a characteristic diagram showing the developing speed in relation to the resist dissolution concentration. In FIG. 1, resist 1 and resist 2 are tested. The developing speed of each resist is standardized by the developing speed in developing solution with the resist dissolution concentration of 0%.

The resist 1 and resist 2 in FIG. 1 are composed of similar components, but are substantially different in a mode of change of the developing solution in relation to the resist dissolution concentration. As shown in FIG. 1, in the case of the resist 1, when the resist dissolution concentration in the developing solution becomes about 0.001%, the developing speed begins to decline. By contrast, in the case of the resist 2, when the resist dissolution concentration in the developing solution becomes about 0.1%, the developing speed begins to decline. The resist dissolution concentration where the developing speed of the resist begins to decline is defined as the "limit dissolution concentration."

When the dissolved resist concentration in the developing solution becomes not lower than the individual limit dissolution concentration of each resist, the developing speed declines. The limit dissolution concentration is intrinsic for each resist. Therefore, when developing the pattern-drawn resist, by developing such that the dissolved resist concentration in the developing solution in the entire region on the substrate is the limit dissolution concentration or less, the developing speed is constant regardless of the pattern density, and the dimensional difference depending on the density is very small.

Figure 2:
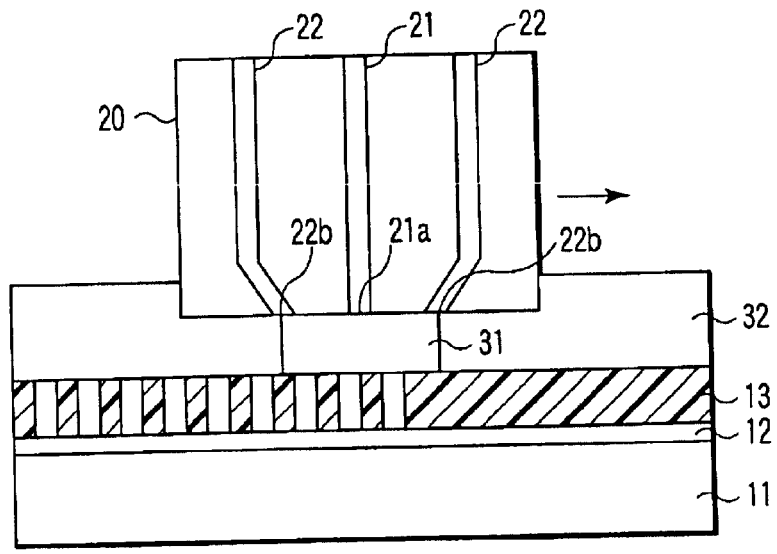
FIG. 2 is a diagram showing a schematic configuration of a developing apparatus according to the first embodiment.

In this embodiment, a developing method by using a developing apparatus shown in FIG. 2 is explained. FIG. 2 is a diagram showing a schematic configuration of the developing apparatus according to the first embodiment of the invention.

As shown in FIG. 2, a resist film 13 is formed on a substrate 11 by way of a reflection preventive film 12. A scan nozzle (solution discharge/suction unit) 20 is disposed oppositely on the substrate 11. The scan nozzle 20 is provided with a solution discharge nozzle 21 for discharging a developing solution 31 from a developing solution discharge port 21a. The scan nozzle 20 also has two suction nozzles 22 for sucking the solution on the substrate 11 from suction ports 22b. The two suction ports 22b are disposed to enclose the developing solution discharge port 21a. There is a moving mechanism (not shown) for moving the scan nozzle, disposed in the direction of arrangement of the developing solution discharge port 21a and suction ports 22b. The shape of the developing solution discharge port 21a and suction ports 22b is a slit shape of which length in the direction orthogonal to the direction of arrangement is longer than the substrate 11.

The developing solution 31 is discharged from the developing solution discharge port 21a of the scan nozzle 20 disposed closely to the substrate 11, and is sucked from the suction ports 22b disposed closely to the developing solution discharge port 21a together with a rinsing solution 32. At this time, the top of the substrate 11 is coated with the rinsing solution 32. Therefore, the developing solution 31 is present only in a region enclosed by the top of the substrate 11, the bottom of the scan nozzle 20, and the suction ports 22b. In this embodiment, by adjusting the moving speed of the scan nozzle 20, the gap between the bottom of the scan nozzle 20 and the substrate 11, and the developing solution discharge speed, the resist dissolution concentration in the developing solution 31 on the substrate 11 is controlled at the limit dissolution concentration or less.

Figure 3:
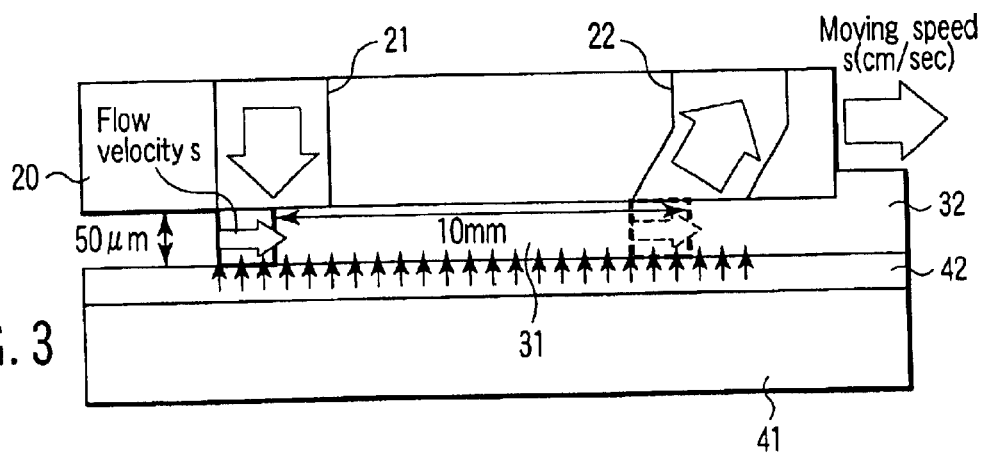
FIG. 3 is a flowchart of a developing method according Lo the first embodiment.

In the developing method explained below, the dissolved resist concentration in the developing solution in the entire region on the substrate is the limit dissolution concentration or less. FIG. 3 is a flowchart showing the developing method according to the first embodiment.

First, changes of the developing speed when the resist is dissolved in the developing solution are experimented at various resist dissolution concentrations. From the results of the experiment, the resist limit dissolution amount is investigated (step S101).

Next is determined the discharge speed of the developing solution discharged from the developing solution discharge port when the dissolved resist concentration in the developing solution in the entire region is the limit dissolution concentration or less (step S102).

At the determined discharge speed, the developing solution is discharged from the developing solution discharge port (step S103).

By developing in this method, it is intended to develop so that the dissolved resist concentration in the developing solution in the entire region on the substrate is the limit dissolution concentration or less, and therefore the developing speed is constant regardless of the pattern density, and the dimensional difference depending on the density is very small.

Figure 4:
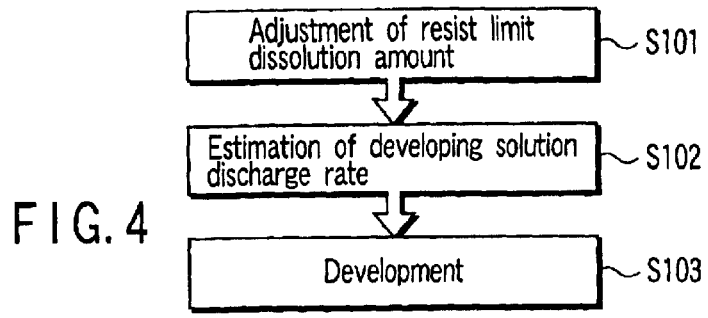
FIG. 4 is a diagram explaining a method of estimating a developing solution discharge rate according to the first embodiment.

A method of estimating the developing solution discharge rate in step S102 is explained by referring to FIG. 4.

In FIG. 4, suppose the moving speed of the scan nozzle 20 to be s (cm/sec), the interval between the center of the developing solution discharge port 21a and center of the suction port 22b to be 10 mm, and the gap between the substrate 11 and the bottom of the scan nozzle 20 to be 50 $\mu$m. At this time, assume the uniformly exposed resist (film thickness 500 nm) is dissolved in the developing solution. Assuming a slender region of height of 50 $\mu$m, width of 1 mm, and depth of 150 mm (volume: vol=75×10$^{-4}$ [cm$^3$]), when the developing solution in this region flows without disturbance in a region enclosed by the top of the substrate 11, the bottom of the scan nozzle 20, and the suction ports 22b, such developing solution discharge speed x (cm$^3$/sec) that the resist dissolution concentration is the limit dissolution concentration or less is determined. Since there are two suction ports 22b, the speed of the developing solution supplied to one suction port 22b is X/2 (cm$^3$/sec).

In the above condition, the flow speed v (cm/sec) of the developing solution in the region is:

$$v = \frac{x/2 [\text{cm}^3/\text{sec}]}{50[\mu m] \times 150[\text{mm}]}$$

$$= \frac{x[\text{cm}^3/\text{sec}]}{50 \times 10^{-4}[\text{cm}] \times 15[\text{cm}] \times 2}$$

$$= \frac{x}{100 \times 10^{-4} \times 15} [\text{cm/sec}]$$

$$= \frac{x}{0.15} [\text{cm/sec}]$$

Therefore, time T (s) required until the developing solution discharged from the discharge port 21a reaches the suction ports 22b is:

$$T = 0.15/x(s).$$

Since the developing solution contacts with the exposed resist 42 for the duration of T (s), the amount of the resist dissolved in the volume vol=75×10⁻⁴ (cm³) in this perio d is calculated. Supposing the residual film of the exposed resist is 0 in ¼ of the time (=developing time) when the resist at a certain point starting to contact with the developing solution becomes the rinsing solution only again, the film reducing speed per second vred is:

$$v_{red} = \frac{500 \times 10^{-7}}{(2 \times 1)/s/4} = 10^{-4} \times s [\text{cm/sec}]$$

Therefore, from the resist film in an area of 1 mm in width and 150 mm in depth, the amount of the resist $R_{vol}$ (cm³) dissolved in the developing solution in T seconds is:

$$R_{vol} = 10^{-4} \times s \times T \times 0.1 \times 15 [\text{cm}^3].$$

Hence, the resist dissolution concentration C is determined in the following formula:

$$C = \frac{R_{vol}}{(75 \times 10^{-7}) \times 100} = \frac{0.3 \times s}{x} [\%]$$

In the case of this embodiment, sine s=0.1 (cm/sec), resist dissolution concentration=0.03/x (%) is determined.

Considering from this result and the limit dissolution concentration, in the resist 1 and resist 2, respectively, the developing solution discharge rate x (cm³/sec) such that the resist dissolution concentration in the developing solution is the limit dissolution concentration or less is determined.

The resist 1 may satisfy the condition of 0.001≧0.03/x. The resist 2 may satisfy the condition of 0.1≧0.03/x.

Therefore, when the developing solution discharge rate in the resist 1 is 30 cm³/sec or more, it is understood that the dissolution concentration of the resist 1 in the developing solution is the limit dissolution concentration or less. Similarly, when the developing solution discharge rate in the resist 2 is 0.3 cm³/sec or more, it is understood that the dissolution concentration of the resist 2 in the developing solution is the limit dissolution concentration or less.

The following is an example of applying the developing method of the embodiment in a photo mask manufacturing process. FIG. 5 is a sectional view showing a photo mask manufacturing process according to the first embodiment of the invention.

Figure 5A:
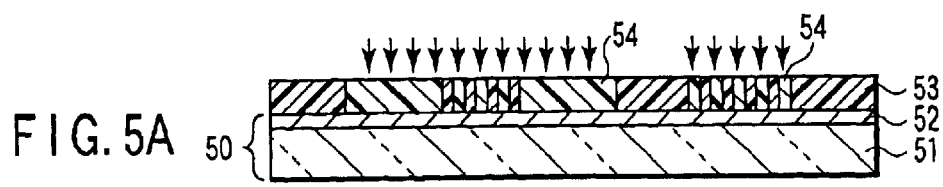
FIGS. 5A to 5C are sectional views showing a photo mask manufacturing process according to the first embodiment.

First, two photo mask substrates are prepared as the substrates to be treated. As shown in FIG. 5A, in a photo mask substrate 50, a Cr light shielding film 52 is formed on a quartz glass 51. A resist agent is applied on the two photo mask substrates 50, and baked to form a resist film 53. In this embodiment, a chemically amplifying type EB positive resist (resist 1) is used as the resist, and its film thickness is 500 nm. Next, a pattern is drawn on the resist film 53 by an EB drawing apparatus. An exposure area 54 is formed by pattern drawing. Then, post-exposure bake (PEB) is executed. The PEB was conducted in the condition of 120° C. and 900 seconds.

Figure 5B:
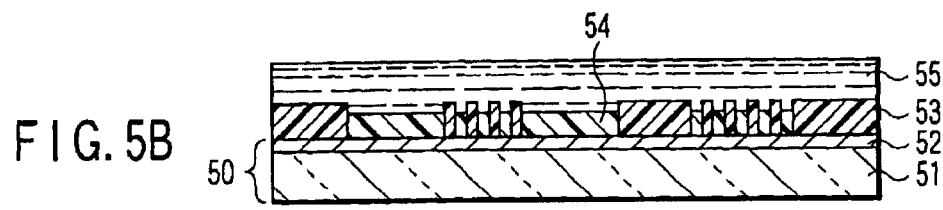
Figure 6A:
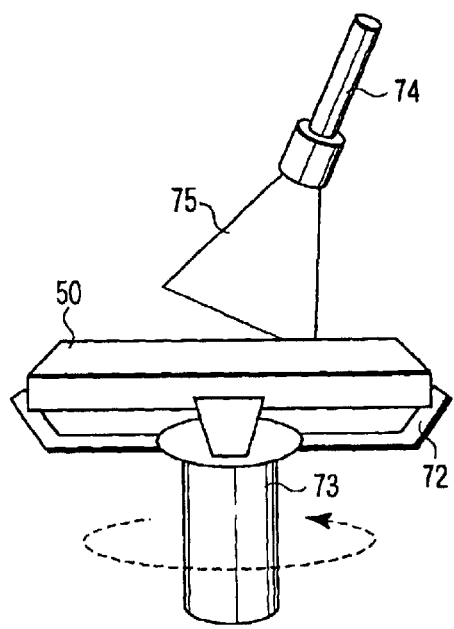
FIGS. 6A and 6B are diagrams showing a configuration of a conventional developing solution.
Figure 6B:
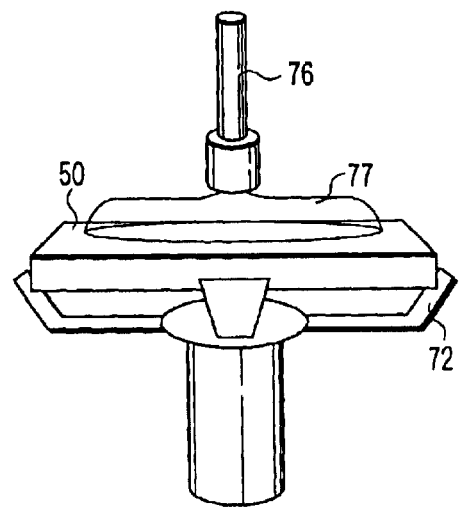

Then, as shown in FIG. 5B, a developing solution 55 is supplied on the two photo mask substrates 50, and the resist film 53 is developed. One photo mask substrate is developed by using the developing apparatus shown in FIG. 2. The developing condition conformed to the estimated condition that the developing solution discharge rate is 30 (cm³/sec) and the nozzle scan speed is 0.1 (cm/sec). The developing time was about 150 seconds. The other photo mask substrate is developed by a developing apparatus shown in FIG. 6A. As shown in FIG. 6A, the photo mask substrate 50 is held by a chuck 72. On the photo mask substrate 50 rotated by a rotating mechanism 73, a developing solution 75 is sprayed from a nozzle 74 to develop. Alternatively, as shown in FIG. 6B, a paddle method may be applied, that is, a developing solution 77 is dropped from a nozzle 76 on the photo mask substrate 50 in a stopped state. In these developing methods (conventional methods), there occurs a region in which the dissolution concentration of the resist 1 in the developing solution is the limit dissolution concentration or more depending on the density of the pattern.

Figure 5C:

After the development, as shown in FIG. 5C, the photo mask substrates 50 are cleaned and dried sequentially.

Both photo mask substrates were put in a plasma etching apparatus, and the Cr light shielding film 52 was dry-etched. In this embodiment, a mixed gas containing chlorine/oxygen and others was used as etching gas. The etching time was about 360 seconds.

Figure 7:
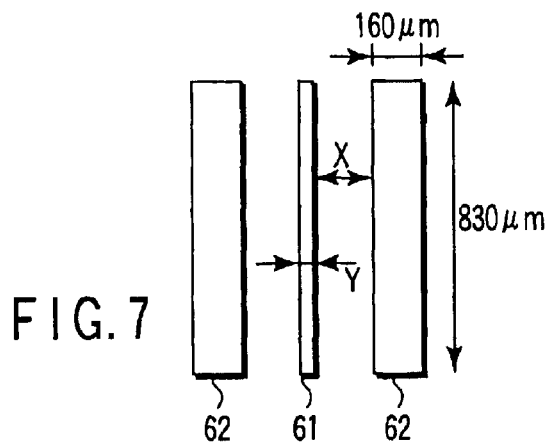
FIG. 7 is a plan view showing a pattern formed by a developing process according to the first embodiment.

Finally, the resist film 53 was peeled off by treatment in a resist ashing apparatus and a resist peeling-off and cleaning apparatus, and a photo mask was completed. The formed pattern is shown in FIG. 7. As shown in FIG. 7, a pad pattern is disposed closely to the line pattern. The distance X between the line pattern and the pad pattern varied in several types in certain regions. The target dimension of the line pattern is fixed at 600 nm.

Figure 8:
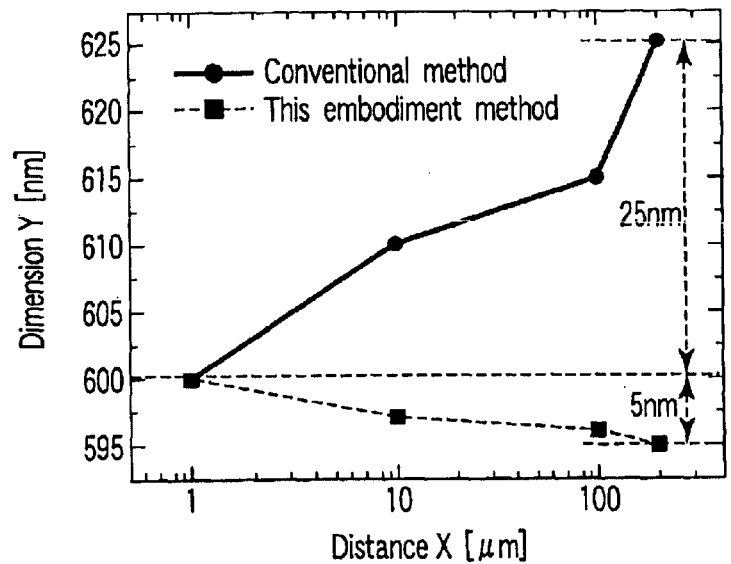
FIG. 8 is a characteristic diagram showing a line pattern dimension Y in relation to a distance X shown in FIG. 7.

The light shielding Cr dimension of the same pattern of two photo mask substrates is measured in a dimension measuring instrument. The result of measurement and explanation of the measuring pattern are shown in FIG. 8. FIG. 8 is a characteristic diagram showing the line pattern dimension Y in relation to the distance X.

In the case of a pattern formed by a conventional developing method, as the distance X is wider, the dimensional error increases. This is because the resist dissolution concentration in the developing solution mounts as the distance X extends, finally exceeding the "limit dissolution concentration", so that the loading effect of development is manifest.

On the other hand, in the case of the pattern formed by the developing method of the embodiment, if the dimension X varies, the dimensional error settles within 5 nm. This is because the resist dissolution concentration is low, being not more than the "limit dissolution concentration".

In this embodiment, the discharge amount of the developing solution was a predetermined specific value, but as far as the resist concentration dissolved in the developing solution is the "limit dissolution concentration" or less, the developing solution discharge amount and nozzle scan speed may be varied depending on the aperture rate in the pattern region to be developed.

Figure 9:
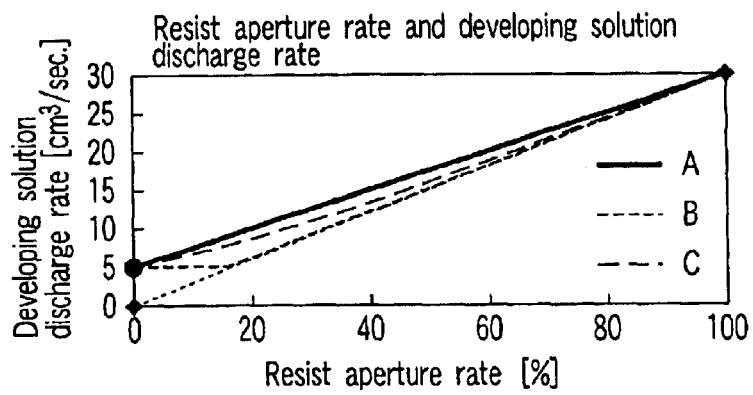
FIG. 9 is a diagram showing an example of a method of setting a resist aperture rate and a developing solution discharge rate.

FIG. 9 is a diagram showing an example of a method of setting the resist opening rate and developing solution discharge amount. In the diagram, A, B and C are determined so that the resist concentration in the developing solution is at a developing solution discharge amount not exceeding the "limit dissolution concentration". FIG. 10 and FIG. 11 are diagrams showing a resist aperture rate distribution and a developing solution discharge amount set value in development of an actual semiconductor wafer and a mask for exposure.

FIG. 10A is a diagram showing a configuration of a semiconductor wafer. FIG. 10B is a diagram showing a distribution of the resist aperture rate from I to I' in FIG. 10A. FIG. 10C is a diagram showing a distribution of the developing solution discharge speed from I to I'. In FIG. 10, a plurality of chips 102 are formed in a wafer 101.

FIG. 11A is a diagram showing a configuration of a mask for exposure. FIG. 11B is a diagram showing a distribution of the resist aperture rate from II to II' in FIG. 11A. FIG. 11C is a diagram showing a distribution of the developing solution discharge speed from II to II'.

As shown in FIG. 10C, FIG. 1C, the consumption of the developing solution can be saved by slowing down the developing solution discharge speed in a region of low pattern aperture rate.

In this embodiment, a photo mask substrate is used as the substrate, but same effects are obtained by using other substrates, such as a semiconductor substrate, a mask substrate for EB exposure or other next-generation lithography, or a substrate for flat panel display.

Second Embodiment

Figure 12:
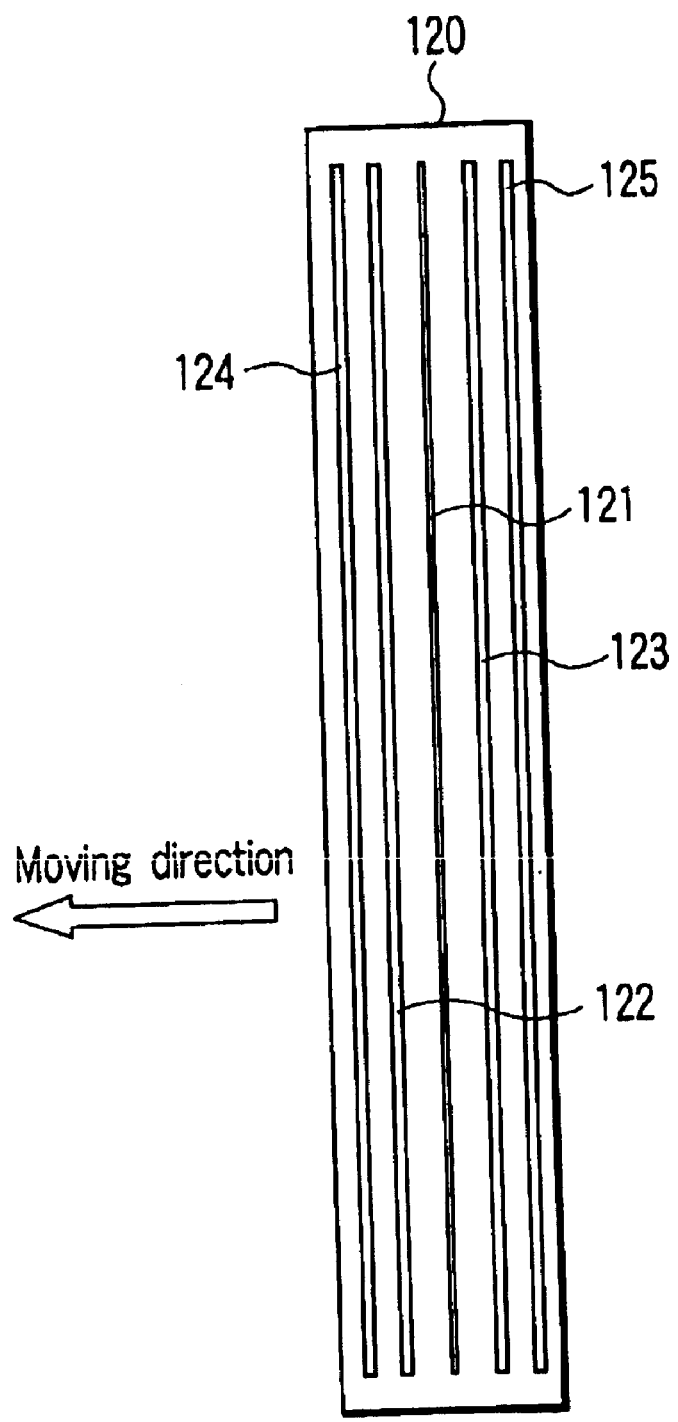
FIG. 12 is a diagram showing a schematic configuration of a developing apparatus according to a second embodiment of the invention.
Figure 13:
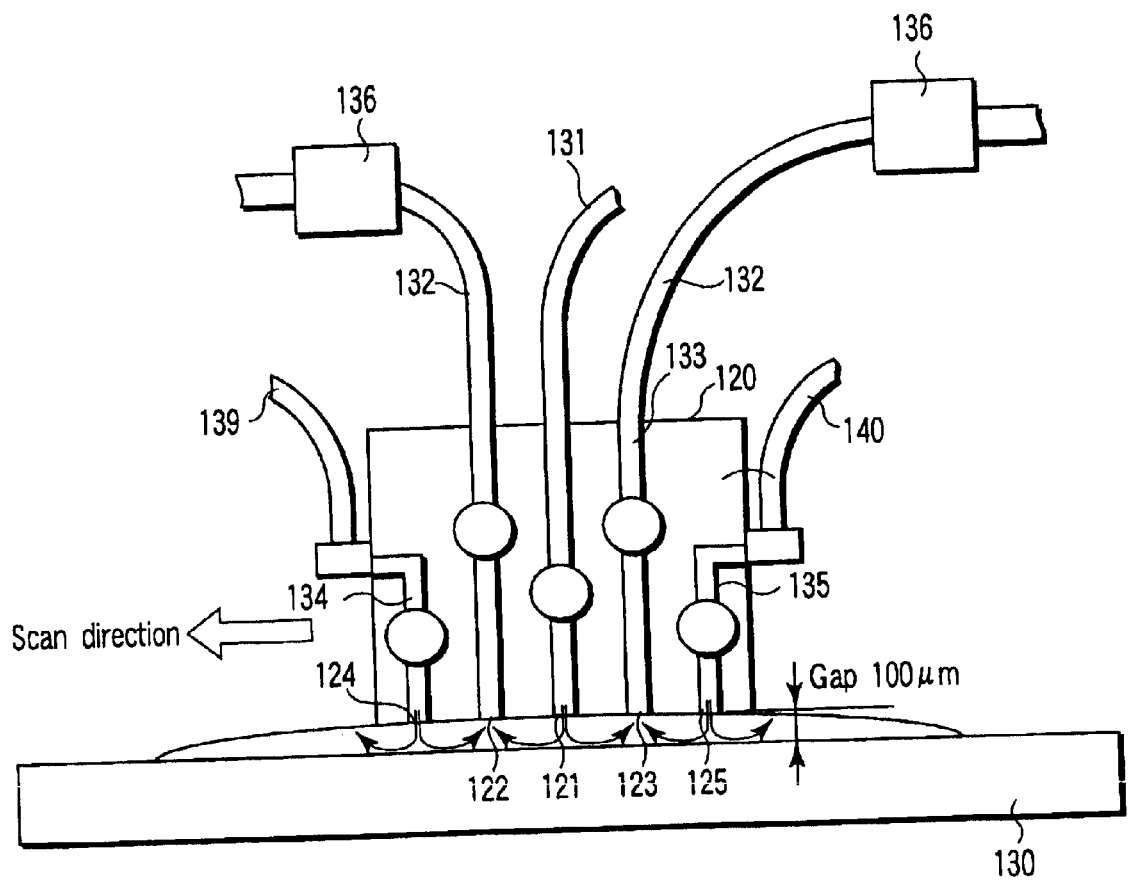
FIG. 13 is a diagram showing a schematic configuration of the developing apparatus according to the second embodiment.
Figure 14:
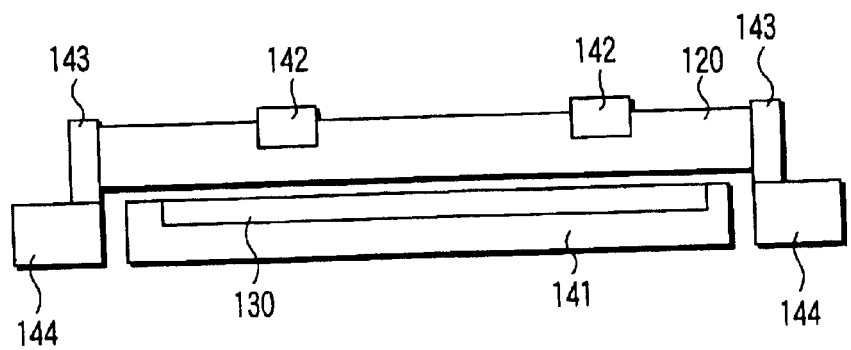
FIG. 14 is a diagram showing a schematic configuration of the developing apparatus according to the second embodiment.

A configuration of a solution discharge/suction unit (called scan nozzle hereinafter) of a developing apparatus used in this embodiment will be explained by referring to FIG. 12 to FIG. 14. FIG. 12 is a plan view showing a configuration of the bottom of a scan nozzle. FIG. 13 is a sectional view showing the configuration of the scan nozzle. FIG. 14 is a view of the scan nozzle from the front side in the moving direction.

The solution discharge/suction unit (called scan nozzle hereinafter) measures about 18 cm in width in a direction perpendicular to the moving direction on the substrate, and 5 cm in depth in a direction parallel to the moving direction. As shown in FIG. 12, there are five slit openings 121 to 125 in the side of the scan nozzle facing the substrate. A developing solution is discharged from the central opening (developing solution discharge slit) 121. A solution on the substrate is sucked from both adjacent openings (suction slits) 122, 123. A prewetting solution or rinsing solution is discharged from two outside openings (prewetting solution discharge slit, rinsing solution discharge slit) 124, 125. The prewetting solution discharge slit 124 for discharging the prewetting solution is disposed ahead in the moving direction, and the rinsing solution discharge slit 125 for discharging the rinsing solution is disposed behind in the moving direction. The developing solution discharge slit 121 measures 150 mm in length and 1 mm in width. The suction slits 122, 123 measure 155 mm in length and 1 mm in width. The prewetting solution discharge slit 124 and rinsing solution discharge slit 125 measure 155 in length and 2 mm in width.

As shown in FIG. 13, the developing solution supplied from a developing solution supply line 136 into a developing solution discharge nozzle 131, is discharged onto a substrate 130 from the developing solution discharge slit 121. The solution sucked from the suction slits 122, 123 is discharged outside of the scan nozzle 120 by way of suction nozzles 132, 133 and suction lines 136, 137. The prewetting solution supplied into a presetting solution discharge nozzle 134 from a prewetting solution supply line 139 is discharged onto the substrate 130 from the prewetting solution discharge slit 124. The rinsing solution supplied into a rinsing solution discharge nozzle 135 from a rinsing solution supply line 140 is discharged onto the substrate 130 from the rinsing solution discharge slit 125.

It is controlled so that the developing solution discharged from the developing solution discharge slit 121 may not escape outside from the suction slits 122, 123. In this control, the suction force from the suction slits 122, 123 and the discharge speed from the developing solution discharge slit 121 are adjusted properly.

In each line, the developing solution, prewetting solution and rinsing solution are supplied from the pumps connected to the lines.

There is a pH meter 151 for measuring pH of the solution sucked from the suction port. In this embodiment, the pH monitor 151 is not used, and it is explained in other embodiment.

As shown in FIG. 14, the developing apparatus comprises a substrate holder 141 on which the substrate 130 is mounted, a gap measuring mechanism 142 provided in the scan nozzle 120, a gap adjusting mechanism 143 provided at both ends of the nozzle 120, and a scan stage 144 for moving the scan nozzle 120 and substrate holder 141 relatively in a nearly horizontal direction.

The gap measuring mechanism 142 is provided at the side of the scan nozzle 120. The gap measuring mechanism 142 measures the gap between the bottom of the scan nozzle 120 and the top of the substrate 130. Laser light is used in measurement.

The gap adjusting mechanism 143 is provided at both ends of the scan nozzle 120, and is installed on the scan stage 144 to be movable in a horizontal straight direction together with the scan nozzle 120.

The gap adjusting mechanism 143 has a piezo element, and is designed to adjust the gap between the bottom of the scan nozzle 120 and the top of the substrate 130 mounted on the substrate holder 141 to a specified value on the basis of the result of measurement by the gap measuring mechanism 142. For example, the gap can be adjusted in a range of 10 to 500 $\mu$m.

FIG. 15 shows the relation between the average aperture rate after development of 5 mm square region in positive type resist, and the gap between the nozzle and the substrate for finishing to a desired resist dimension. It is known that as the aperture rate is larger, the appropriate gap becomes narrower. This is because the volume of the resist to be removed is increased as the aperture rate is larger, and the flow speed of the developing solution must be increased to replace with a fresh developing solution quickly. By narrowing the gap, the volume of the developing solution passing per unit time in the unit volume region contacting with the substrate increases, and the developing solution on the resist can be replaced quickly.

FIG. 16 shows the relation between the gap between the nozzle and the substrate surface and the resist dimension after development. The developing solution speed is fixed at 0.2 liter/min. It is known from FIG. 16 that the dimension changes suddenly when the gap is more than 0.5 mm. This is because, as the gap increases, the flow speed of the developing solution on the resist surface slows down, and the replacement efficiency of the developing solution drops. That is, the gap between the substrate and the nozzle is preferred to be 0.5 mm or less, but if it is too narrow, contact of the substrate and nozzle may occur due to nozzle processing precision or gap control precision. Therefore, it should be somewhere between 0.01 mm and 0.5 mm realistically.

FIG. 17 shows the relation between the average flow speed of the developing solution flowing in the gap between the nozzle and the substrate, and the resist dimension after development. The average flow speed of the developing solution is calculated from the gap and discharge speed of the developing solution. As shown in FIG. 17, when the average flow speed is less than 0.02 m/sec, the development dimension changes suddenly. This is because the flow speed of the developing solution on the resist surface slows down and the replacement efficiency of the developing solution declines. Therefore, the average flow speed of the developing solution is preferred to be 0.02 m/sec or more.

An example in which a photo mask is actually manufactured on the basis of these relations will be explained below.

In Cr mask blanks on which a positive type chemically amplifying resist of 400 nm in thickness is applied, a layer of a system LSI device pattern is drawn by using an electronic beam drawing apparatus.

Figure 18:
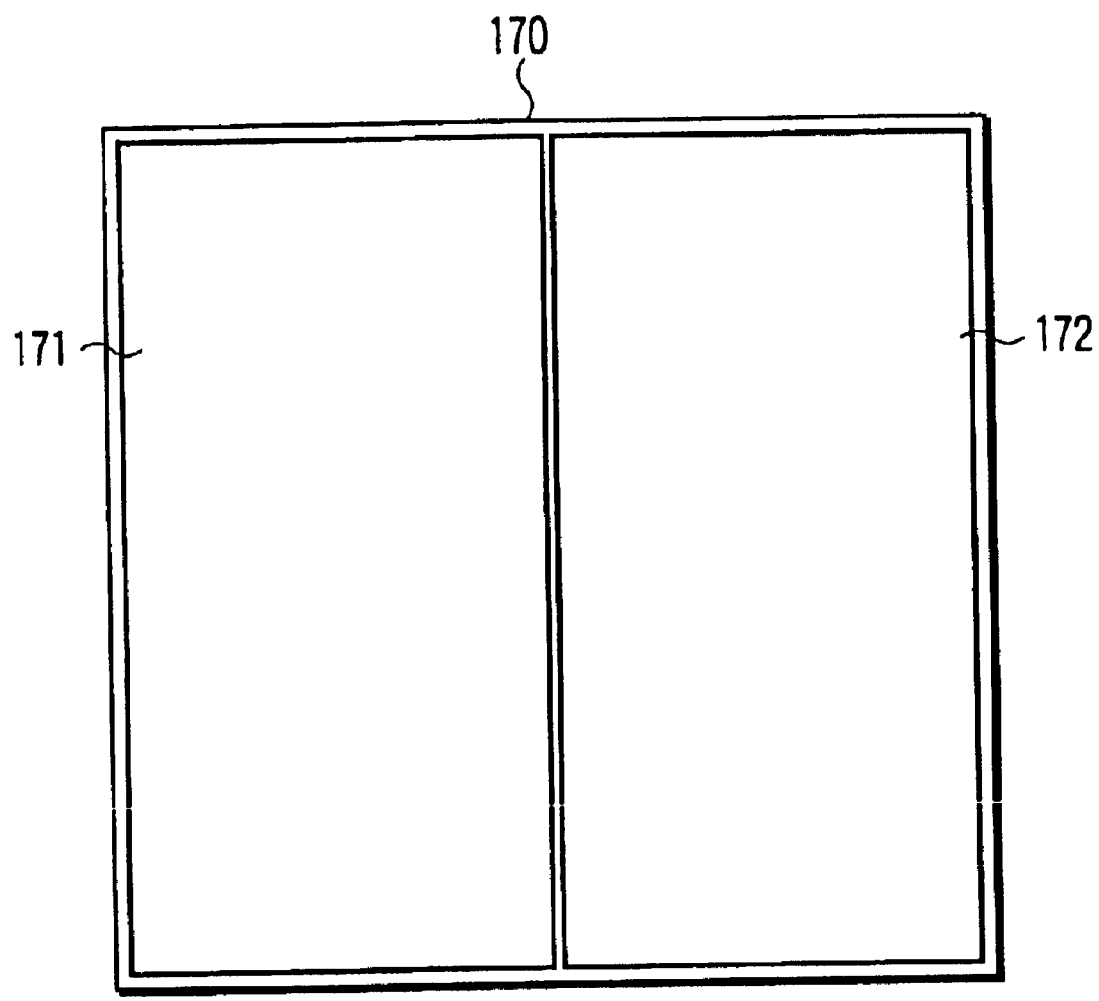
FIG. 18 is a plan view showing an aperture rate of a layer of a drawn system LSI device pattern according to the second embodiment.

An outline of the layer of the system LSI device pattern to be drawn is shown in FIG. 18. FIG. 18 is a plan view showing an outline of the layer of the system LSI device pattern according to the second embodiment of the invention. As shown in FIG. 18, half of a system LSI device pattern 170 is a logic device. The other half is a memory device region. The aperture rate of the resist pattern after development is 45% in the memory device region 171, and 80% in the logic device region 172. It is largely different between the memory device region 171 and the logic device region 172.

Hitherto, when developing such pattern, the memory device region 171 is deviated from a desired dimension in the condition of finishing within the desired dimension in the logic device region 172. To finish within the desired dimension simultaneously in the both regions 171, 172, it has been required to change the dimension of the pattern to be drawn. However, to change the drawing data depending on places, it takes much time and cost for data conversion, and a considerable improvement has been needed.

Figure 19A:
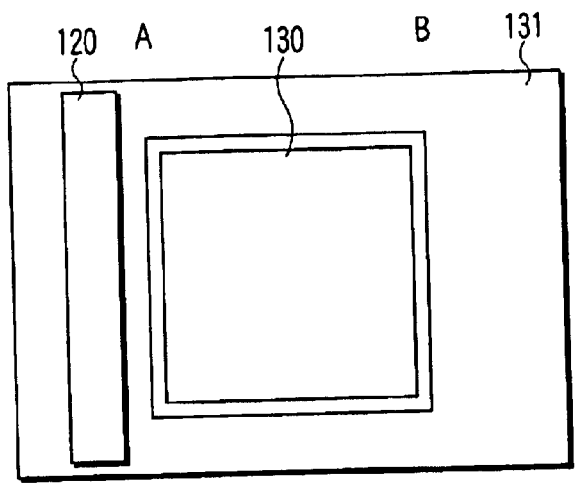
FIGS. 19A to 19C are diagrams showing a mode of motion of a scan nozzle in a developing process according to the second embodiment.
Figure 19B:
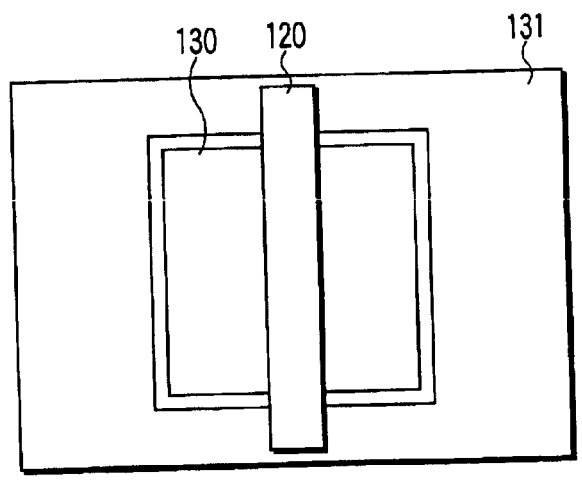
Figure 19C:
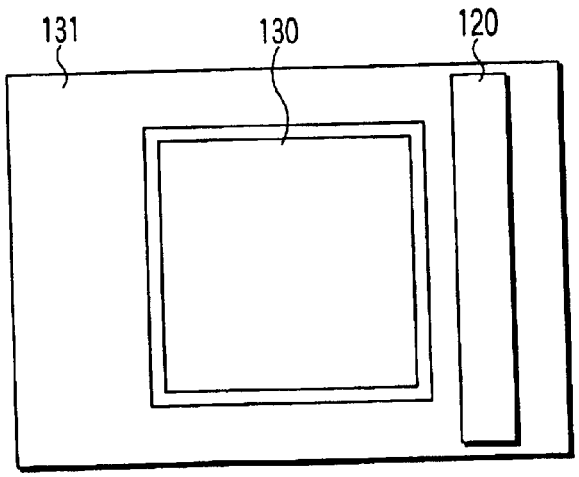
Figure 20:
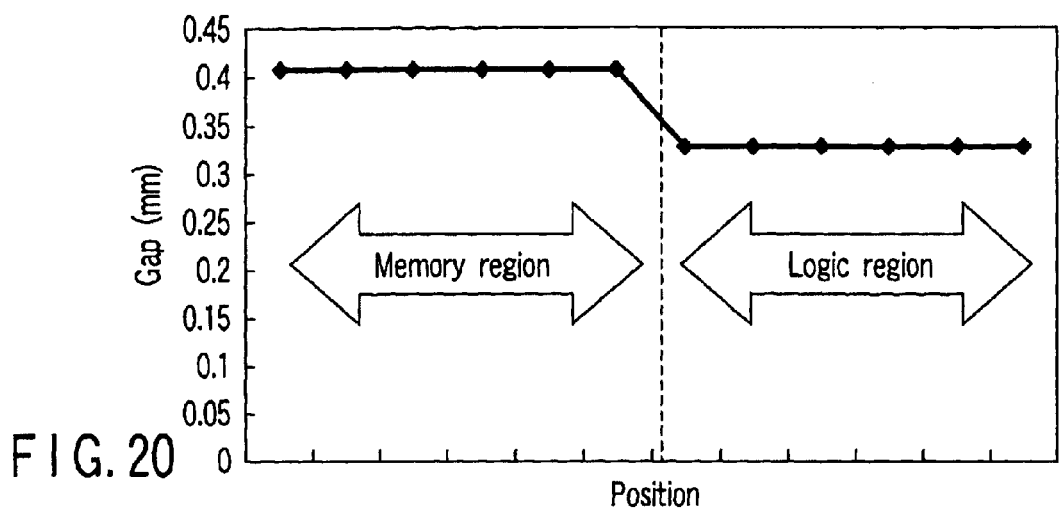
FIG. 20 is a diagram showing the relation between a position of the scan nozzle and the gap according to the second embodiment.

After drawing, it was baked for 15 minutes at 110 degrees. Next, the substrate 130 is put on the substrate holder 141 of the developing apparatus. As shown in FIG. 19A to FIG. 19C, from one end A to the opposite other end B, the scan nozzle 120 is moved linearly at a constant speed to perform development. At this time, the gap between the bottom of the scan nozzle 120 and the top of the substrate 130 is controlled to a desired dimension according to the average aperture rate of the pattern in a region between two suction slits 122, 123. FIG. 20 shows the relation between the position of the scan nozzle and the gap. That is, the gap is narrowed in the logic device region 172 with the large aperture rate, and the gap is widened in the memory device region 171 with the small aperture rate. The moving speed of the scan nozzle 120 is 1 mm/sec. The developing solution is a 0.27 normal alkaline developing solution. The discharge speed is 0.2 liter/min. The interval between the developing solution discharge slit and the suction slits is 5 mm, being at both sides of the developing solution discharge slit, and the width of the solution discharge slit is 1 mm. Therefore, the developing solution is present between the scan nozzle and the substrate surface in about 11 mm in a direction parallel to the moving direction. In other words, at a specific point on the substrate surface, the time of the developing solution passing this point is about 11 seconds, and the effective developing time is about 11 seconds.

By this developing process, after discharge of the developing solution, the developing solution flows in the interval between the nozzle and the substrate surface at high speed and is immediately sucked and removed, so that a fresh developing solution is always supplied on the resist surface. Owing to this effect, a uniform developing process can be applied in the entire photo mask surface.

Subsequently, using the formed resist pattern as the etching mask, the Cr film is etched by reactive ion etching. The etching gas is a mixed gas of chlorine gas and oxygen gas. The resist was removed by an ashing apparatus, and it was cleaned by a cleaning apparatus. The formed Cr pattern dimension was measured by a dimension measuring instrument. The difference of the average of the pattern dimension from the target dimension was 2 nm, and the in-plane uniformity of the Cr pattern dimension was 6 nm ($3\sigma$) without distribution depending on the aperture rate.

In an experiment to confirm the efficacy of the developing method explained in this embodiment, using a shipped mask, the wafer was exposed by an ArF scanner, and the exposure tolerance was evaluated. In evaluation, varying the defocus amount and exposure amount, the dimension of the resist pattern formed on the wafer was measured by using SEM. As a result, the defocus tolerance when the variation of the resist pattern dimension formed on the wafer is 10% or less was 0.40 $\mu$m, and the exposure tolerance at this time was 12%.

This embodiment is an example of application in a positive type resist, but it goes without saying that the embodiment can be similarly applied in a negative type resist. Further, the embodiment is an example of application in the developing process of the mask manufacturing process, but not limited to this, it may be applied in flat panel display manufacturing process, wafer process, and the like, in all kinds of solution treatment such as resist stripping, surface natural oxide film removing, and cleaning.

Third Embodiment

In the second embodiment, there is described the developing method for finishing the pattern uniformly by adjusting the gap depending on the ratio of the exposure unit. This embodiment relates to a developing method for finishing the pattern uniformly by adjusting the scan speed of the scan nozzle depending on the ratio of the exposure unit.

Figure 21:
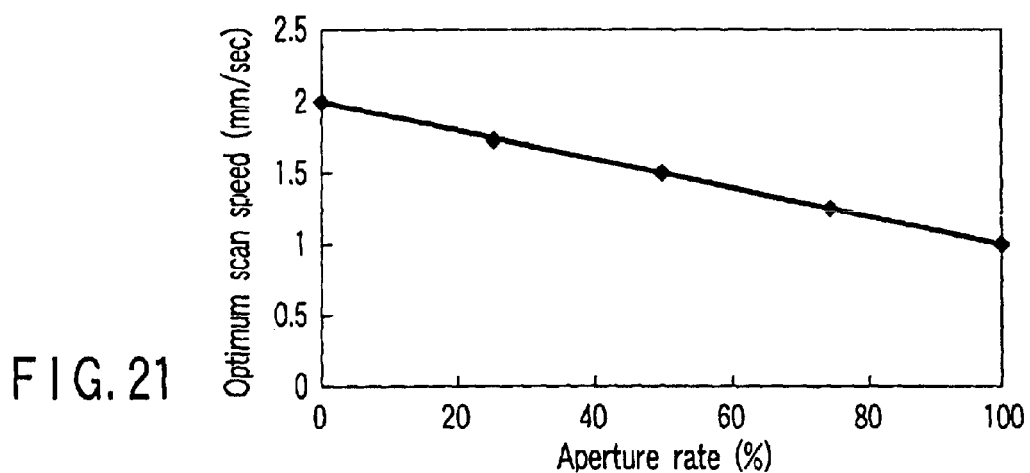
FIG. 21 is a diagram showing the relation between an average aperture rate after development of a 5 mm square region in positive type resist, and a scan speed of a nozzle for finishing to a desired resist dimension according to a third embodiment of the invention.

FIG. 21 shows the relation between the average aperture rate after development of a 5 mm square region in positive type resist, and the scan speed of the nozzle for finishing to a desired resist dimension. As shown in FIG. 21, it is found that, as the aperture rate increases, an appropriate scan speed slows down. This is because, as the aperture rate is larger, the volume of resist to be removed increases, and the developing solution must flow a longer time to supply a fresh developing solution by a greater volume. By making use of this relation, an example in which a photo mask is actually manufactured will be explained below.

The resist application condition, exposure pattern, exposure condition, and PEB condition are same as in the second embodiment, and the explanation is omitted herein.

Figure 22:
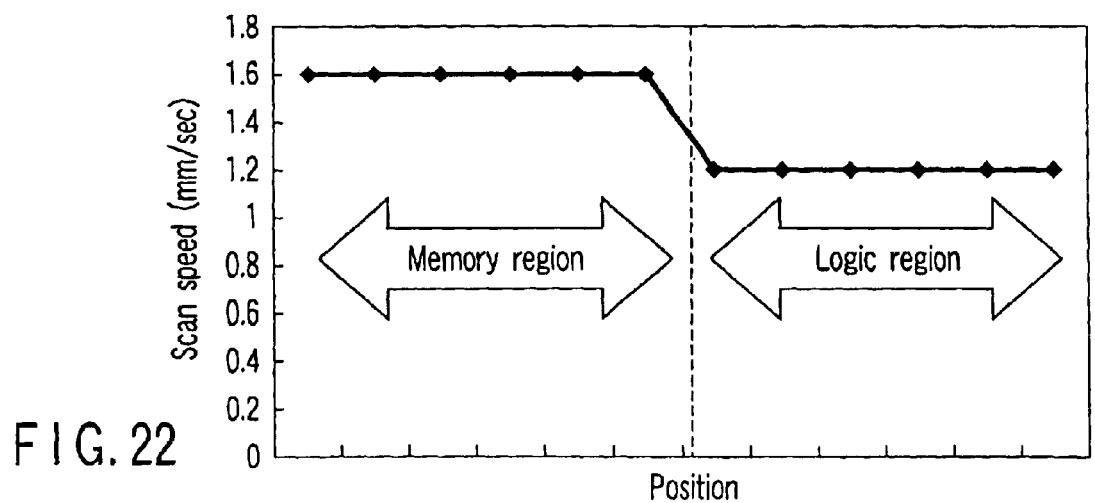
FIG. 22 is a diagram showing the relation between a position of the scan nozzle and the scan speed according to the third embodiment.

Same as in the second embodiment, the scan nozzle is moved from one end to the other end of the substrate to scan and develop. At the time of scanning, the development is performed by varying the scan speed depending on the aperture rate. Depending on the average aperture rate of the pattern existing between the two suction ports, the scan speed was controlled in the developing process. FIG. 22 shows the relation between the position of the scan nozzle and the scan speed.

As shown in FIG. 22, in the logic device region with the large aperture rate, the scan speed is decelerated, and in the memory device region with the small aperture rate, the scan speed is accelerated. The developing solution used was 0.27 normal alkaline developing solution. The discharge speed of the developing solution was set at 0.2 liter/min.

The interval between the developing solution discharge slit and the suction slits is 5 mm. Two suction slits are located at both sides of the developing solution discharge slit, and their width is 1 mm. Therefore, the developing solution is present between the scan nozzle and the substrate surface in about 11 mm in a direction parallel to the moving direction. In other words, at a specific point on the substrate surface, the time of the developing solution passing this point is about 7 to 9 seconds, and the effective developing time is about 7 to 9 seconds.

By this developing process of the embodiment, after discharge of the developing solution, the developing solution flows in the interval between the nozzle and the substrate surface at high speed and is immediately sucked and removed, and also the necessary developing time depending on the aperture rate is assured, so that a fresh developing solution is always supplied on the resist surface. Owing to this effect, a uniform developing process is applied in the entire photo mask surface.

Subsequently, using the formed resist pattern as the etching mask, the Cr film is etched by reactive ion etching. The etching gas is a mixed gas of chlorine gas and oxygen gas. The resist was removed by an ashing apparatus, and it was cleaned by a cleaning apparatus. The formed Cr pattern dimension was measured by a dimension measuring instrument. The difference of the average of the pattern dimension from the target dimension was 2 nm, and the in-plane uniformity of the Cr pattern dimension was 6 nm (3σ) without distribution depending on the aperture rate.

In an experiment to confirm the efficacy of this method, using a shipped mask, the wafer was exposed by an ArF scanner, and the exposure tolerance was evaluated. In evaluation, varying the defocus amount and exposure amount, the dimension of the resist pattern formed on the wafer was measured by using SEM. As a result, the defocus tolerance when the variation of the resist pattern dimension formed on the wafer is 10% or less was 0.40 μm, and the exposure tolerance at this time was 12%.

This embodiment is an example of application in a positive type resist, but it goes without saying that the embodiment can be similarly applied in a negative type resist. In the case of the negative type resist, the scan speed is increased where the aperture rate is large, and the scan speed is decreased where the aperture rate is small.

Further, the embodiment is an example of application in the developing process of the mask manufacturing process, but not limited to this, it may be applied in flat panel display manufacturing process, wafer process, and the like, in all kinds of solution treatment such as resist stripping, surface natural oxide film removing, and cleaning.

Fourth Embodiment

In the second and third embodiments, there is described a developing method for finishing the pattern uniformly by adjusting the gap or scan speed depending on the ratio of the exposure unit. This embodiment relates to a developing method for finishing the pattern uniformly by adjusting the developing solution discharge speed of the scan nozzle depending on the ratio of the exposure unit.

Figure 23:
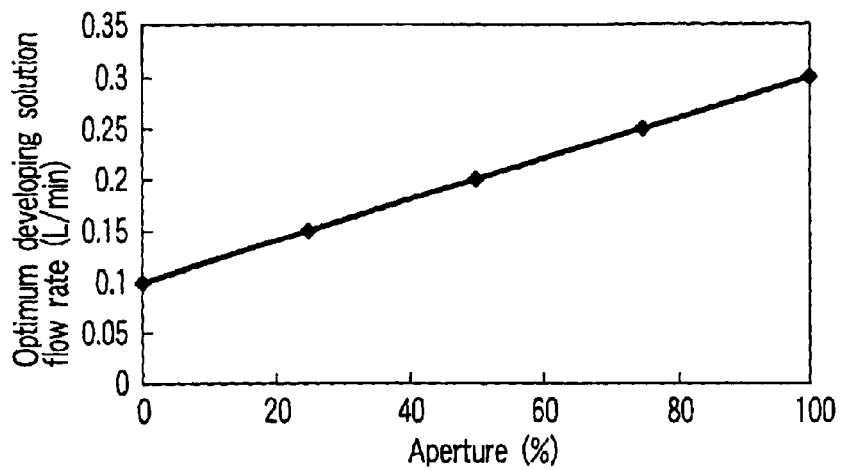
FIG. 23 is a diagram showing the relation between an average aperture rate after development of a 5 mm square region in positive type resist, and a discharge speed of developing solution for finishing to a desired resist dimension according to a fourth embodiment of the invention.

FIG. 23 shows the relation between the average aperture rate after development of a 5 mm square region in positive type resist, and the developing solution discharge speed for finishing to a desired resist dimension.

As shown in FIG. 23, it is found that as the aperture rate increases, an appropriate developing solution discharge speed increases. This is because, as the aperture rate is larger, the volume of resist to be removed increases, and therefore the developing solution must flow more to supply a fresh developing solution quickly. The average developing solution flow speed is calculated by dividing the sectional area of the space in which the developing solution flows between the scan nozzle and the substrate, by the supply speed of the developing solution flowing in this space.

In this embodiment, the gap between the scan nozzle and the substrate is 50 μm, and the width of the discharge port and suction ports is 150 mm, and hence the sectional area of the space in which the developing solution flows is about 7.5 mm$^2$. When the developing solution is discharged at a discharge rate of 5 ml/min, the flow speed is about 5.5 mm/sec.

Herein, the moving speed of the scan nozzle is fixed at 1 mm/sec, and the development was performed at various developing solution discharge rates. As a result, when the flow speed of the developing solution is 1 mm/sec or less, it is found that the pattern dimension changes suddenly. This is found because the developing solution flow speed and scan speed are nearly identical from the developing solution discharge slit to the rinse slit side (rear side in the scan direction). When two speeds are equal, the developing solution is not replaced. That is, it is preferred that the flow velocity of the developing solution flowing in the interval between the substrate and the nozzle is faster than the nozzle scan speed. By making use of this relation, an example in which a photo mask is actually manufactured will be explained below.

The resist application condition, exposure pattern, exposure condition, and PEB condition are same as in the second embodiment, and the explanation is omitted herein.

Figure 24:
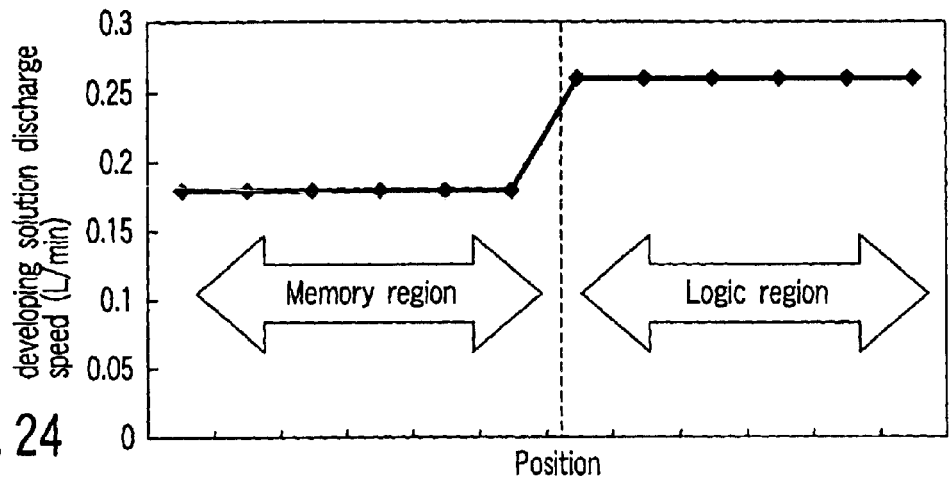
FIG. 24 is a diagram showing the relation between a position of the scan nozzle and the scan speed according to the fourth embodiment.

Same as in the second embodiment, the scan nozzle is moved from one end to the other end of the substrate to scan and develop. At the time of scanning, the development is performed by varying the developing solution discharge speed depending on the aperture rate. Depending on the average aperture rate of the pattern existing between the two suction ports, the developing solution discharge speed was controlled in the developing process. FIG. 24 shows the relation between the position of the scan nozzle and the scan speed.

As shown in FIG. 24, the developing solution discharge speed was increased where the aperture rate was large, and the developing solution discharge speed was decreased where the aperture rate was small. The developing solution discharge speed varied from 0.18 to 0.26 liter/min depending on the aperture rate. The developing solution was 0.27 normal alkaline developing solution. The interval between the developing solution discharge slit and the suction slits is 5 mm. Two suction slits are located at both sides of the developing solution discharge slit. The width of the solution discharge slit is 1 mm. Therefore, the developing solution is present between the scan nozzle and the substrate surface in about 11 mm in a direction parallel to the moving direction. In other words, at a specific point on the substrate surface, the time of the developing solution passing this point is about 11 seconds, and the effective developing time is about 11 seconds.

By this developing process, after discharge of the developing solution, the developing solution flows in the interval between the nozzle and the substrate surface at high speed and is immediately sucked and removed, and also the necessary developing solution flow rate depending on the aperture rate is assured, so that a fresh developing solution is always supplied on the resist surface. Owing to this effect, a uniform developing process is applied in the entire photo mask surface.

Subsequently, using the formed resist pattern as the etching mask, the Cr film is etched by reactive ion etching. The etching gas is a mixed gas of chlorine gas and oxygen gas. The resist was removed by an ashing apparatus, and it was cleaned by a cleaning apparatus.

The formed Cr pattern dimension was measured by a dimension measuring instrument. As a result, the difference of the average of the pattern dimension from the target dimension was 2 nm, and the in-plane uniformity of the Cr pattern dimension was 6 nm ($3\sigma$) without distribution depending on the aperture rate.

In an experiment to confirm the efficacy of the developing process of this embodiment, using a shipped mask, the wafer was exposed by an ArF scanner, and the exposure tolerance was evaluated. In evaluation, varying the defocus amount and exposure amount, the dimension of the resist pattern formed on the wafer was measured by using SEM. As a result, the defocus tolerance when the variation of the resist pattern dimension formed on the wafer is 10% or less was 0.40 µm, and the exposure tolerance at this time was 12%.

This embodiment is an example of application in a positive type resist, but it goes without saying that the embodiment can be similarly applied in a negative type resist. In the case of the negative type resist, the developing solution discharge speed is decreased where the aperture rate is large, and the developing solution discharge speed is increased where the aperture rate is small. Further, the embodiment is an example of application in the developing process of the mask manufacturing process, but not limited to this, it may be applied in flat panel display manufacturing process, wafer process, and the like, in all kinds of solution treatment such as resist stripping, surface natural oxide film removing, and cleaning.

Fifth Embodiment

There is described a developing method of controlling the scan speed so as to achieve a desired pH value from the pH meter always monitoring the pH value of the sucked solution.

An example in which a photo mask is actually manufactured will be explained below. The resist application condition, exposure pattern, exposure condition, and PEB condition are same as in the second embodiment, and the explanation is omitted herein.

Same as in the second embodiment, the scan nozzle is moved from one end to the other end of the substrate to scan and develop. At the time of scanning, the development is performed by varying the scan speed so that the measured value of the pH meter may nearly maintain the value of a fresh developing solution.

Figure 25:
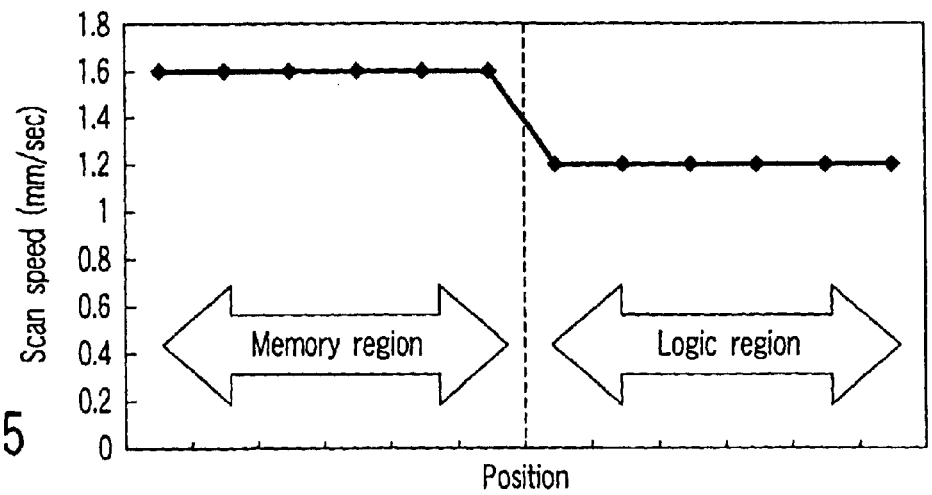
FIG. 25 is a diagram showing the relation between the scan speed and a pattern aperture rate at the nozzle bottom according to the fourth embodiment.

FIG. 25 shows the relation between the scan speed and the pattern aperture rate of the bottom of the nozzle. As a result, the scan speed was slow where the aperture rate was large, and the scan speed was fast where the aperture rate was small. Depending on the aperture rate, the scan speed varied from 1.2 to 1.6 mm/sec. The developing solution was 0.27 normal alkaline developing solution. The discharge rate of the developing solution was set at 0.2 liter/min.

The interval between the developing solution discharge slit and the suction slits is 5 mm. Two suction slits are located at both sides of the developing solution discharge slit. The width of the solution discharge slit is 1 mm. Therefore, the developing solution is present between the scan nozzle and the substrate surface in about 11 mm in a direction parallel to the moving direction. In other words, at a specific point on the substrate surface, the time of the developing solution passing this point is about 7 to 9 seconds, and the effective developing time is about 7 to 9 seconds.

By this developing process, after discharge of the developing solution, the developing solution flows in the interval between the nozzle and the substrate surface at high speed and is immediately sucked and removed, and also the necessary developing time depending on the aperture rate is assured, so that a fresh developing solution is always supplied on the resist surface. Owing to this effect, a uniform developing process is applied in the entire photo mask surface.

Subsequently, using the formed resist pattern as etching mask, the Cr film is etched by reactive ion etching. The etching gas is a mixed gas of chlorine gas and oxygen gas. The resist was removed by an ashing apparatus, and it was cleaned by a cleaning apparatus. The formed Cr pattern dimension was measured by a dimension measuring instrument. As a result, the difference of the average of the pattern dimension from the target dimension was 2 nm, and the in-plane uniformity of the Cr pattern dimension was 6 nm ($3\sigma$) without distribution depending on the aperture rate.

In an experiment to confirm the efficacy of this developing method, using a shipped mask, the wafer was exposed by an ArF scanner, and the exposure tolerance was evaluated. In evaluation, varying the defocus amount and exposure amount, the dimension of the resist pattern formed on the wafer was measured by using SEM. As a result, the defocus tolerance when the variation of the resist pattern dimension formed on the wafer is 10% or less was 0.40 µm, and the exposure tolerance at this time was 12%.

In this embodiment, the concentration of the sucked developing solution was measured by a pH monitor, but it may be also monitored by optical permeability or electric conductivity. Further, the embodiment is an example of application in the developing process of the mask manufacturing process, but not limited to this, it may be applied in flat panel display manufacturing process, wafer process, and the like, in all kinds of solution treatment such as resist stripping, surface natural oxide film removing, and cleaning.

Sixth Embodiment

This embodiment explains a process of cleaning a photo mask substrate after resist stripping. The cleaning apparatus used herein is same as the developing apparatus used in the second embodiment. However, ozone water is discharged, instead of the developing solution, from the developing solution discharge port. Instead of the pH counter, a particle counter is provided. Other configuration is the same, and the illustration and explanation are omitted.

The mask after resist stripping having a Cr pattern formed was inspected by a defect inspection apparatus, and 280 foreign particles were identified. As a result of cleaning this mask by a conventional mask cleaning machine, the number of foreign particles was decreased to 73. However, this number of foreign particles is not sufficient. Accordingly, in the same conventional cleaning apparatus, it was cleaned three times and the number of foreign particles was reduced to zero. Thus, conventionally, the cleaning capacity was not enough, and it took much time to remove foreign particles.

Similarly, a mask having 332 foreign particles after resist stripping was investigated by putting a substrate in the cleaning apparatus, and ozone water treatment was conducted from one end A to the opposite other end B by varying the scan speed so that the measurement of the particle counter is 0.1 particle/min or less. The ozone water discharge speed was set at 0.2 liter/min. If heavily contaminated, the scan speed may drop to zero before the particle counter becomes 0.1 particle/min or less.

The interval between the ozone water discharge slit and suction slits is 5 mm. Two suction slits are located at both sides of the ozone water discharge slit. The width of the solution discharge slit is 1 mm. Therefore, the ozone water is present between the scan nozzle and the substrate surface in about 11 mm in a direction parallel to the moving direction.

By this cleaning, after discharge of the ozone water, the ozone water flows in the interval between the nozzle and the substrate surface at high speed to remove foreign matters, and is immediately sucked and remove. Hence, re-sticking of foreign matters to the mask is prevented.

By ozone water treatment while varying the scan speed so that the value of the particle counter is 0.1 particle/min or less, the mask surface is always clean, and uniform ozone water treatment is realized on the entire surface of the photo mask substrate. As a result, the number of foreign particles on the mask after cleaning is zero, and stable cleaning conforming to the cleanliness of the mask is realized.

In this embodiment, the cleanliness is measured by a particle counter, but it may be also monitored by optical permeability or electric conductivity. Further, the embodiment is an example of application in the developing process of the mask manufacturing process, but not limited to this, may be applied in flat panel display manufaturing process, wafer process, and the like, in all kind of solution treatment such as resist stripping, surface natural oxide film removing, and cleaning.

Seventh Embodiment

This embodiment of the invention is explained by referring to the drawings. First, the solution discharge/suction unit of the substrate treating apparatus used in the invention is described.

The developing apparatus of the invention comprises two scan nozzles same as the scan nozzle explained in the second embodiment in FIG. 12 to FIG. 14. The developing apparatus is explained by referring to FIG. 26. FIG. is a plan view showing a configuration of the bottom of the scan nozzle relating to the seventh embodiment of the invention.

Figure 26:
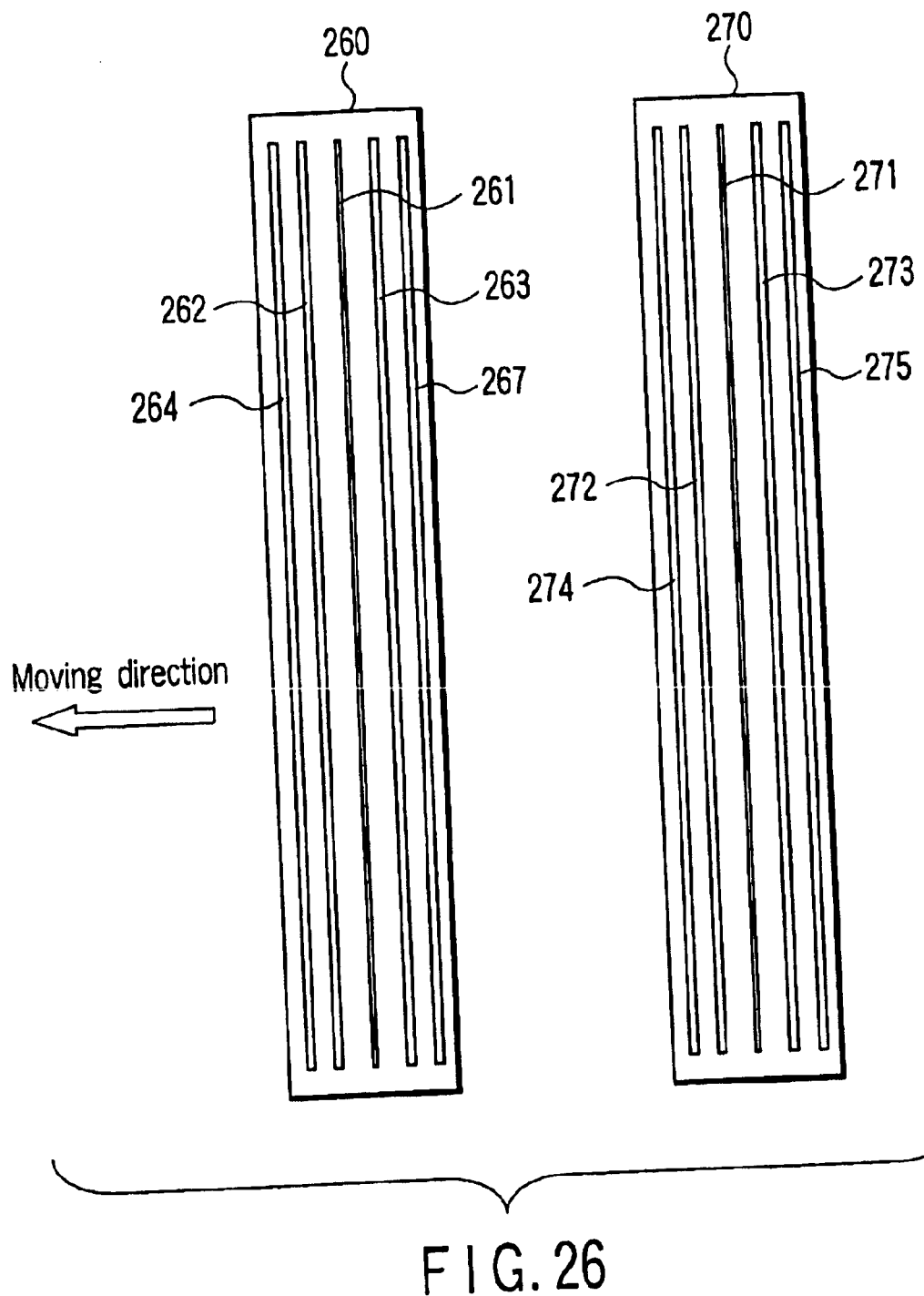
FIG. 26 is a diagram showing a schematic configuration of a developing apparatus according to a seventh embodiment of the invention.

As shown in FIG. 26, having two solution disharge/suction units (hereinafter called scan nozzles) of identical structure, each scan nozzle measure about 35 cm in width in a direction perpendicular to the moving direction to the substrate, and 5 cm in width in a direction parallel to the moving direction. Five slit openings are provided in the bottom of each scan nozzle facing the substrate.

First, the configuration of a first scan nozzle 260 is explained. Ozone water is discharged from a middle ozone water discharge slit 261. A solution (ozone water, prewetting solution, rinsing solution) on the substrate is sucked from two first adjacent slits 262, 263. Prewetting solution or rinsing solution is discharged from two outside openings (first prewetting solution discharge slit, second rinsing solution discharge slit) 264, 265. The prewetting solution discharge slit 264 for discharging the prewetting solution is disposed ahead in the moving direction, and the rinsing solution discharge slit 265 for discharging the rinsing solution is disposed behind in the moving direction.

The configuration of a second scan nozzle 270 is explained. A developing solution is discharged from a middle developing solution discharge slit 271. A solution (developing solution, prewetting solution, rinsing solution) on the substrate is sucked from two adjacent slits 272, 273. Prewetting solution or rinsing solution is discharged from two outside openings (prewetting solution discharge slit, rinsing solution discharge slit) 274, 275. The prewetting solution discharge slit 274 for discharging the prewetting solution is disposed ahead in the moving direction, and the rinsing solution discharge slit 275 for discharging the rinsing solution is disposed behind in the moving direction.

The ozone water discharge slit 261 and developing solution discharge slit 271 measure 310 mm in length and 1 mm in width. The first to fourth suction slits 262, 263, 272, 273 measure 310 mm in length and 3 mm in width. The first and second prewetting solution discharge slits 264, 274 and the first and second rinsing solution discharge slits 265, 275 measure 310 mm in length and 3 mm in width. The suction force from the suction slits 262, 263, 272, 273 and the discharge speed from the ozone water or developing solution discharge slits 261, 271 are balanced, so that the solution (developing solution, ozone water) discharged from the ozone water or developing solution discharge slits 261, 271 does not escape outside from the suction slits. The prewetting solution and rinsing solution are both pure water, and supplied from each solution discharge slit by pumps.

The scan nozzles 260, 270 comprise, as shown in FIG. 13 and FIG. 14, a gap measuring mechanism 142 provided in the scan nozzle 120, a gap adjusting mechanism 143 provided at both ends of the scan nozzle 120, and a scan stage 144 for moving the scan nozzle 120 and substrate holder 141 relatively in a nearly horizontal direction.

An example of substrate treatment is described. In a Cr mask blank coated with a positive type chemically amplifying resist in a thickness of 500 nm, a pattern of DRAM of line and space system of 0.1 $\mu$m rule was drawn by using an electron beam drawing apparatus having an acceleration voltage of 50 keV. After drawing, the blank was baked for 15 minutes at 110 degrees. In this baking process, if the acid evaporated from the resist is stuck again to the resist, the state of hardly soluble layer of the resist surface varies depending on the drawing surface rate, which causes to fluctuate the pattern dimension after development, and the dimensional uniformity is worsened.

Figure 27A:
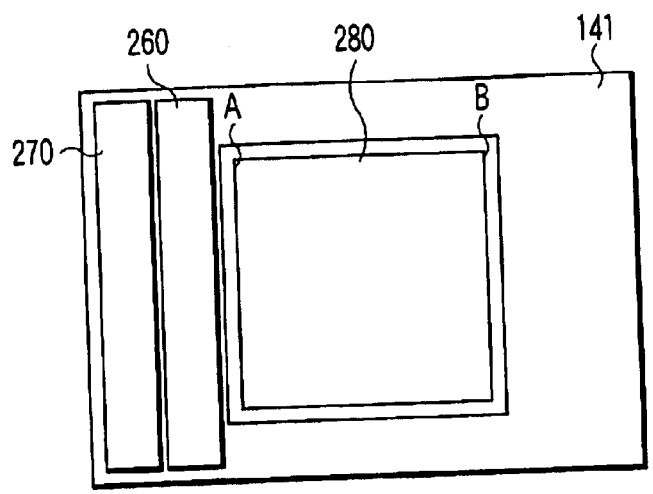
FIG. 27A to FIG. 27F are diagrams showing a mode of motion of a scan nozzle in a developing process according to the seventh embodiment.
Figure 27B:
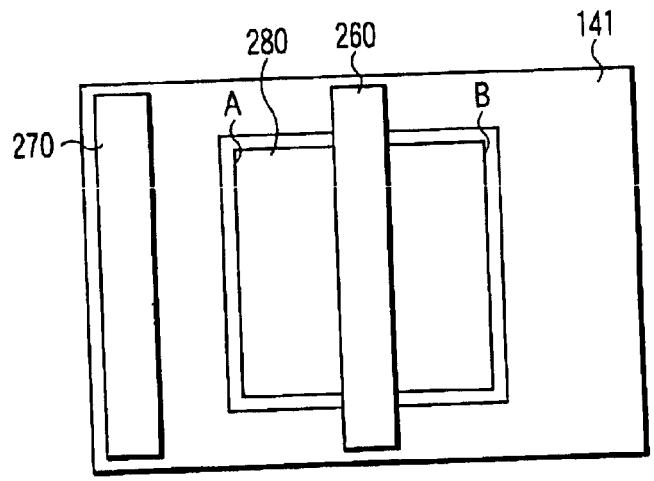
Figure 27C:
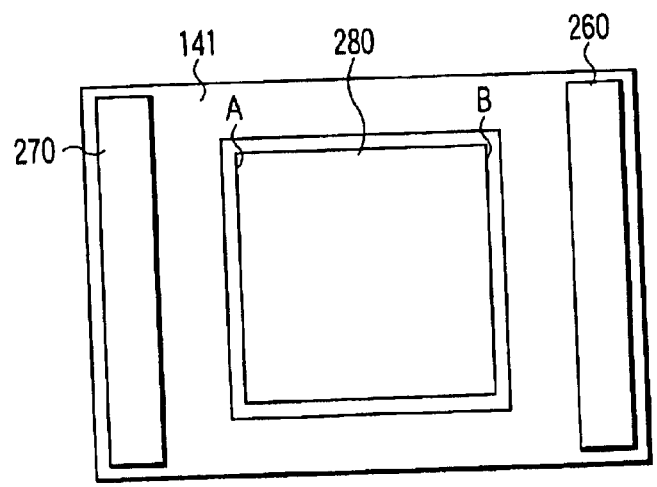
Figure 27D:
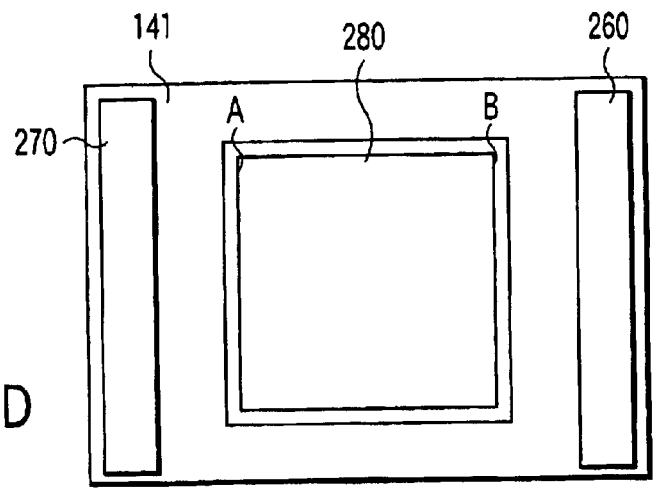
Figure 27E:
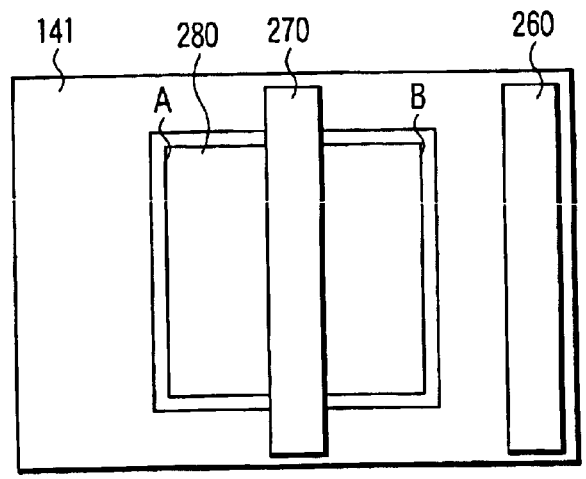
Figure 27F:
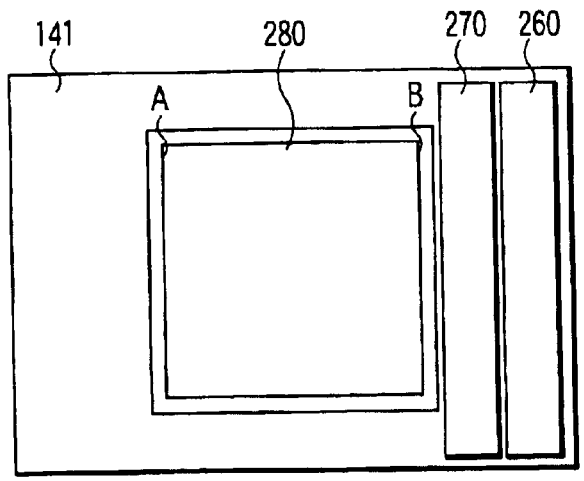

Subsequently, the substrate is put on the developing apparatus. As shown in FIGS. 27A to 27C, from one end A of the substrate 130 to the opposite other end B, the first scan nozzle 260 for ozone water treatment is moved at a constant speed to treat with ozone water. The moving speed of the first scan nozzle 260 is set at 20 mm/sec. The ozone concentration of the ozone water is 5 ppm, and the discharge speed is 1 liter/min. The interval between the ozone water discharge slit 261 and the suction slits 262, 263 is 10 mm, and the width of the ozone water discharge slit 261 is 1 mm, and therefore the ozone water is present between the scan nozzle and the substrate surface in about 21 mm in a direction parallel to the moving direction. In other words, at a specific point on the substrate surface, the time of the ozone water passing this point is about 1 second, and the effective ozone water treating time is about 1 second. By this short-time ozone water treatment, only the very thin hardly soluble layer formed on the resist surface can be removed, and resist dissolution in the next developing process begins uniformly. By using this apparatus, solution treatment in a very short time can be done uniformly in a plane.

Figure 28:
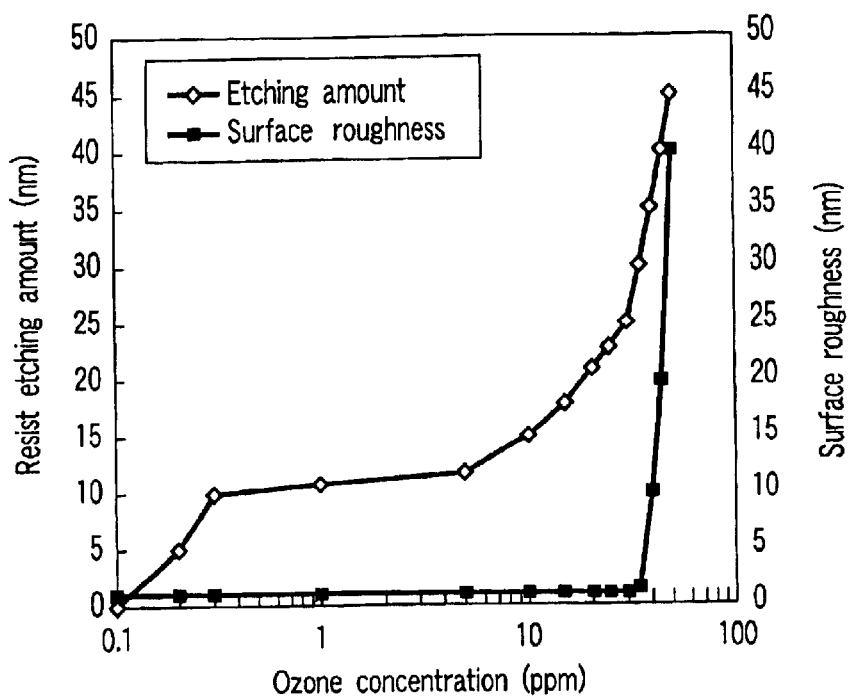
FIG. 28 is a diagram showing the relation between the ozone water concentration, resist etching rate, and resist surface roughness.

By the conventional combination of spray and substrate rotation or combination of paddle and spin drying, the in-plane treating time varies and uniform treatment is not realized. FIG. 28 shows the relation between the ozone water concentration, resist etching amount, and resist surface roughness. It is found that, at 0.2 ppm or more, the resist etching effect is small, and at 35 ppm, the surface roughness increases suddenly. Hence, the ozone concentration of ozone water is preferably somewhere between 0.2 ppm and 35 ppm. It is more preferred to use ozone water at ozone concentration of 0.2 ppm or more to 5 ppm or less.

Next, the second scan nozzle 270 for developing process is moved, as shown in FIGS. 27D to 28F, from one end A of the substrate 130 to the opposite other end B, at a constant speed in developing process. The moving speed is 1 mm/sec. The developing solution is 0.27 normal alkaline developing solution. The discharge speed is 0.5 liter/min. The interval between the developing solution discharge slit 271 and the suction slits 272, 273 is 10 mm, and the width of the developing solution discharge slit 271 is 1 mm. Therefore the developing solution is present between the second scan nozzle 270 and the substrate surface in about 21 mm in a direction parallel to the moving direction. In other words, at a specific point on the substrate surface, the time of the developing solution passing this point is about 21 seconds, and the effective developing time is about 21 seconds. By this development treatment, resist dissolution begins uniformly, and after discharge of the developing solution, the developing solution flows at high speed in the interval between the nozzle and the substrate surface, and is immediately sucked and removed, so that a fresh developing solution may be always supplied on the resist surface, thereby realizing a uniform developing process over the entire surface of the photo mask. That is, it is realized only by the combination of uniform ozone water treatment and developing process by close scan nozzles.

Subsequently, using the formed resist pattern as etching mask, the Cr film is etched by reactive ion etching. The etching gas is a mixed gas of chlorine gas and oxygen gas. The resist was removed by an ashing apparatus, and it was cleaned by a cleaning apparatus. The formed Cr pattern dimension was measured by a dimension measuring instrument. As a result, the difference of the average of the pattern dimension from the target dimension was 2 nm, and the in-plane uniformity of the Cr pattern dimension was 6 nm ($3\sigma$).

In an experiment to confirm the efficacy of this developing method, using a shipped mask, the wafer was exposed by an ArF scanner, and the exposure tolerance was evaluated. In evaluation, varying the defocus amount and exposure amount, the dimension of the resist pattern formed on the wafer was measured by using SEM. As a result, the defocus tolerance when the variation of the resist pattern dimension formed on the wafer is 10% or less was 0.40 $\mu$m, and the exposure tolerance at this time was 12%.

The embodiment is not only an example of application in the developing process of the mask manufacturing process, but also may be applied in flat panel display manufacturing process, wafer process, and the like, in all kinds of solution treatment such as resist stripping, surface natural oxide film removing, and cleaning.

Eighth Embodiment

In the first embodiment of the invention, an example of developing a wafer is explained in detail by referring to FIG. 1.

Figure 31:
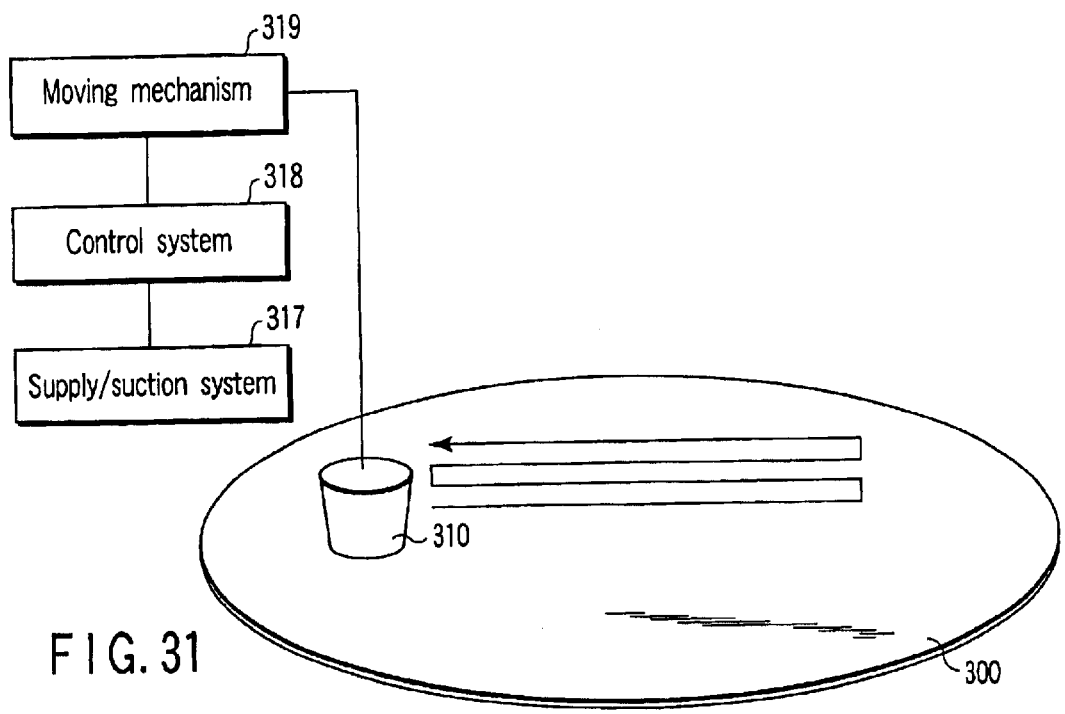
FIG. 31 is a diagram showing a schematic configuration of the developing apparatus according to the eighth embodiment.
Figure 32:
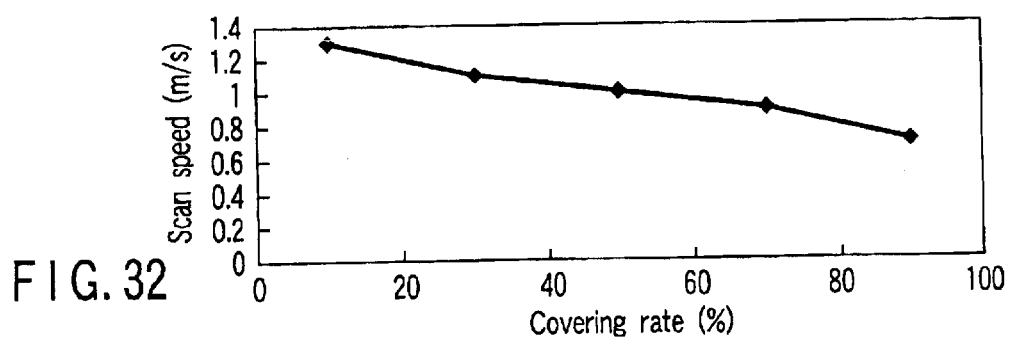
FIG. 32 is a diagram showing the relation between a pattern covering rate in a 0.13 μm pattern and nozzle scan speed according to the eighth embodiment.

FIGS. 29, 31, 32 are diagrams showing a schematic configuration of a developing apparatus according to an eighth embodiment of the invention.

Figure 29A:
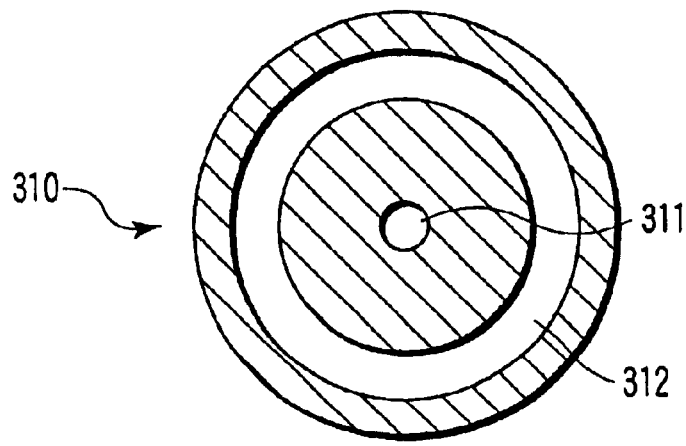
FIGS. 29A and 29B are diagrams showing a schematic configuration of a developing apparatus according to an eighth embodiment of the invention.
Figure 29B:
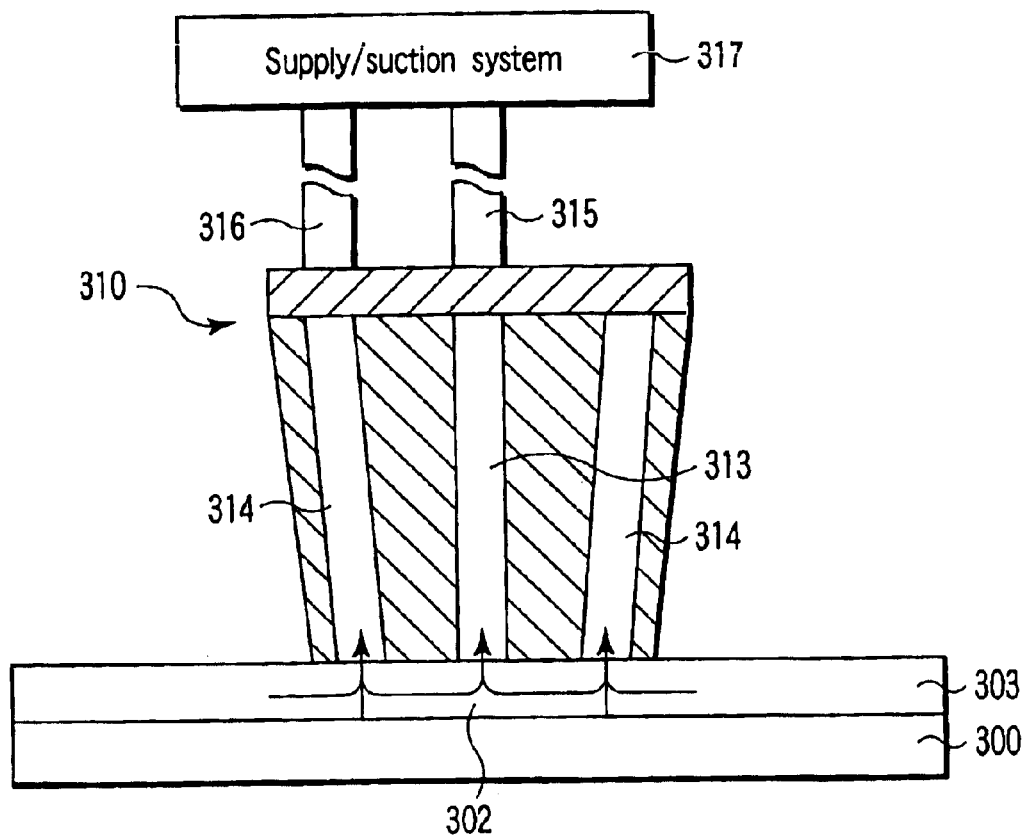

As shown in FIGS. 29A and 29B, a developing nozzle 310 of the developing apparatus includes a developing solution discharge nozzle 313 and a suction nozzle 314. The developing solution discharge nozzle 313 has a developing solution discharge port 311 disposed at a side opposite to a substrate 300. The developing solution discharge nozzle 313 has a suction port 312 disposed at a side opposite to the substrate 300. The suction port 312 is disposed so as to surround continuously the periphery of the developing solution discharge port 311.

In the developing solution discharge nozzle 313, a developing solution is supplied through a developing solution lead pipe 315 by pressing a solution canister (not shown) of a supply and suction system 317. The supplied developing solution is discharged from the developing solution discharge port 311. The suction nozzle 314 is connected to a pump of the supply/suction system 317 by way of a discharge pipe 316. By the suction force of the pump, the solution on the substrate 300 is sucked from the suction port. By simultaneous discharge and suction, the developing solution 301 is present only in a region between the developing solution discharge port 311 and the suction port 312.

Figure 30:
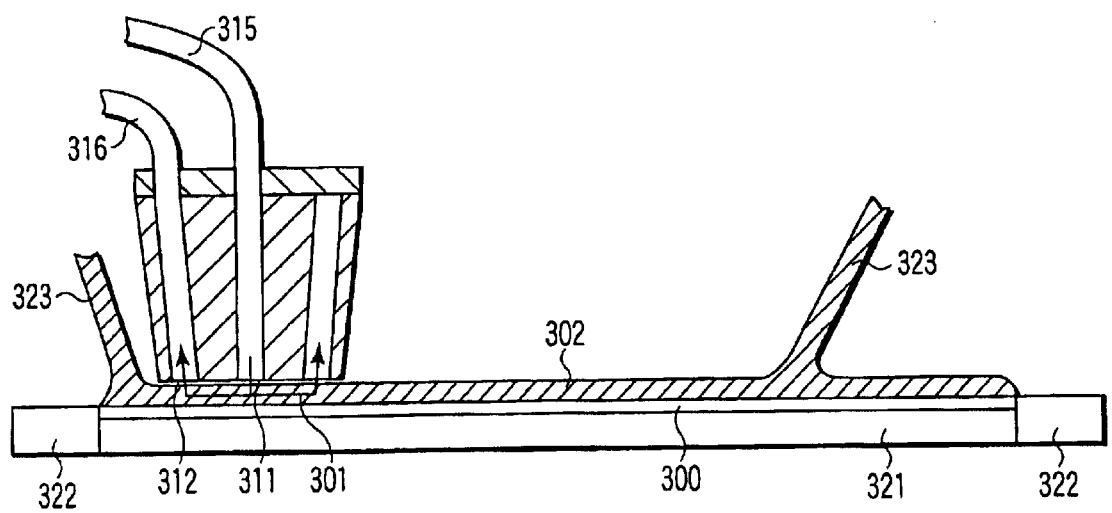
FIG. 30 is a diagram showing a schematic configuration of the developing apparatus according to the eighth embodiment.

As shown in FIG. 30, the substrate 300 is held by a vacuum chuck 321. An auxiliary plate 322 is provided around the substrate. The auxiliary plate 322 has a drive mechanism for moving up and down. The surface of the auxiliary plate 322 is preferred to have a nearly same wettability to developing solution as the top of the substrate 310. A rinsing solution supply nozzle 323 is provided for supplying a rinsing solution to the substrate 310. The rinsing solution supply nozzle 323 supplies the rinsing solution continuously. The top of the substrate 300 is filled with the rinsing solution supplied from the rinsing solution supply nozzle 323. Therefore, the suction port 312 sucks a mixed solution of developing solution and rinsing solution. Discharge and suction of developing solution and discharge of rinsing solution are executed simultaneously.

As shown in FIG. 31, a moving mechanism 319 is provided for moving the developing nozzle 310 relatively to the substrate 300. The moving mechanism 319 moves the developing nozzle 310 in the horizontal direction and perpendicular direction. A control system 318 controls the supply/suction system 317 and moving mechanism 319. The control system 318 controls the developing solution discharge speed, developing solution discharge time, suction speed, suction time, rinsing solution discharge amount, discharge time, nozzle moving speed, etc.

As shown in FIG. 29B, the developing solution discharged from the developing solution discharge port 311 forms a flow toward the suction port 312 disposed to surround its periphery, and only the region enclosed by the inside of the suction port 312 is developed. That is, the control system 318 keeps a balance of the developing solution discharge pressure and suction pressure such that the developing solution does not leak outside of the suction port 312.

The treating region by the developing solution is set at $4\pi$ mm$^2$. The distance between the bottom of the nozzle 310 and the substrate 300 is set at about 100 $\mu$m. A method of supplying developing solution on the wafer is specifically described below. On a wafer having formed thereon a photosensitive resin film such as resist of 0.4 $\mu$m in thickness on a base film to be processed, a pattern formed on a mask by a KrF excimer stepper is transferred, and a pattern latent image of 0.13 m is formed on the photosensitive thin film. This wafer is held horizontally by a wafer holder. The developing solution was TMAH (normality of 0.27N), and the developing solution discharge speed and suction speed were adjusted.

The developing solution discharge port diameter was set at 2 mm, suction port inside diameter at 3.5 mm, suction port outside diameter at 4.5 mm, developing solution discharge speed at 100 cc/min, suction speed at 100 cc/min, and rinsing solution discharge speed at 300 cc/min.

The treating method will be explained below.

First of all, the wafer substrate is held by the vacuum chuck 321. The developing nozzle 310 is moved above the end on the wafer principal plane. The top of the auxiliary plate 322 is set at the same height as the wafer surface. The nozzle 310 is moved to a position above a gap of 100 μm from the upper end of the water principal plane, and to a development start point.

The procedure for determining the treating condition is explained. FIG. 32 shows the relation between the pattern covering rate in the pattern of 0.13 μm and the nozzle scan speed. The pattern covering rate refers to the area rate of the resist remaining on the substrate, not being dissolved by the developing solution in the developing process.

When the covering rate is larger, the resist pattern dimension is finished larger by using the positive resist as compared with the case of smaller covering rate. Accordingly, a desired dimension is obtained by varying the scan speed depending on the covering rate. The change rate is indicated depending on the covering rate. This method is to calculate the covering rate in the treating region formed by the developing solution flowing into the suction port from the developing solution discharge port, and further calculate the scan speed of the nozzle for finishing to a desired pattern size from this value according to the data of the prelininary experiment.

Figures 33A, 33B:
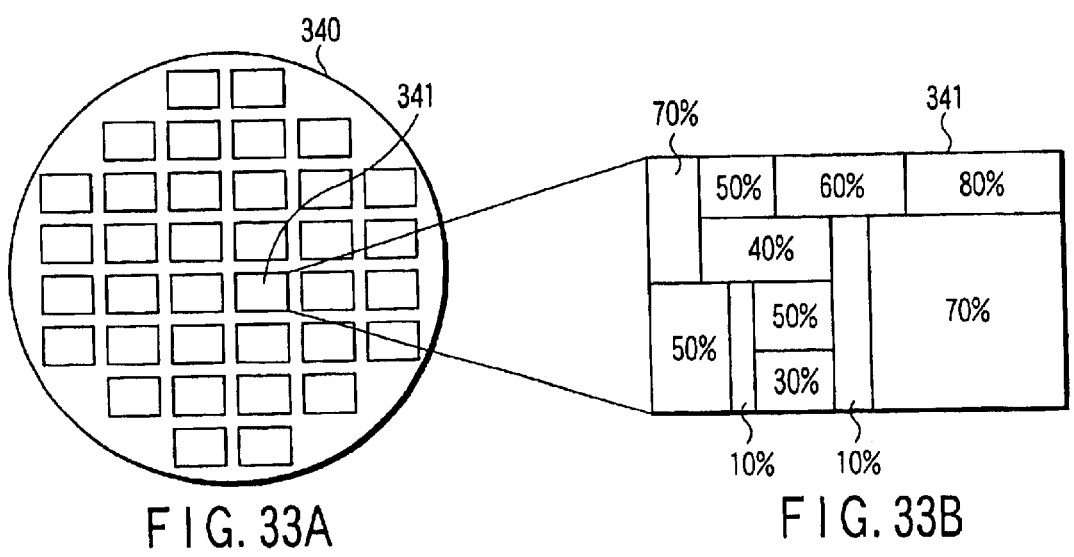
FIGS. 33A and 33B are diagrams showing a chip covering rate distribution in wafer according to the eighth embodiment.

The covering rate distribution of the chip in the wafer to be processed this time is shown in FIG. 33. FIG. 33A is a plan view showing the configuration of the wafer. FIG. 33B is a diagram showing a covering rate distribution in the chip 341 in the wafer 340 can be determined from design data. At the forward side of the moving direction of the developing nozzle, a light source for illuminating the substrate, and a reflected light intensity measuring system for measuring the reflected light intensity from the substrate are provided. The intensity meter for measuring the intensity of the reflected light is preferred to be a line sensor longer than the width of the treating region of measurement of a reflected light intensity measuring system and the treating region shape.

Instead of the reflected light intensity, by measuring the intensity of transmitted light, it can be determined from the change of the measuring result of the reflected light intensity measuring system and the treating region light intensity measuring system and the treating region shape.

The developing nozzle 310 is moved onto a scan start point of the chip 341. By executing developing solution discharge, developing solution suction, and rinsing solution discharge simultaneously, scanning of the developing nozzle 310 is started. The track of the developing nozzle 310 is shown in FIG. 34. FIG. 35 shows the relation between the treating time and the scan speed. After start of scan, the nozzle passes the region with the covering rate of 50%, and the scan speed at this time is 1 mm/sec as shown in FIG. 35, and later when the nozzle passes the region with the covering rate of 10%, and the scan speed at this time is 1.3 mm/sec, and thus it is designed to treat at the scan speed depending on the covering rate of the region of passing of the nozzle. In the boundary region of the treating region, the nozzle scan speed is defined so as to finish at a desired pattern size.

After the developing process, the substrate was rotated, the solution on the substrate was shaken off, and the substrate was dried, and the resist pattern was formed completely.

FIG. 36 shows the relation between the deviation of the formed pattern from the target value and the covering rate. The pattern size was formed within a deviation of ±5 nm from the target value in the entire region.

This embodiment shows an example of application of development of resist, but is not limited to development of resist only. For example, it can be also applied in wet etching of wafer, development, wet etching and cleaning of the photosensitive film on the substrate in the process of manufacturing the photo mask for semiconductor manufacture, and development of color filter manufacturing process, DVD or other disk processing process, and the like.

Figure 37A:
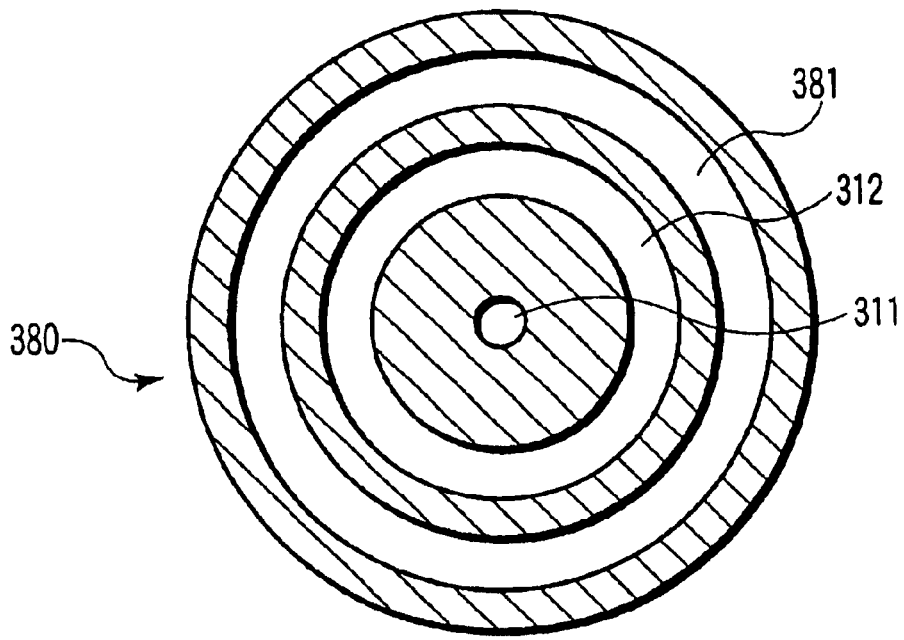
FIGS. 37A and 37B are diagrams showing a modified example of the developing nozzle according to the eighth embodiment.
Figure 37B:
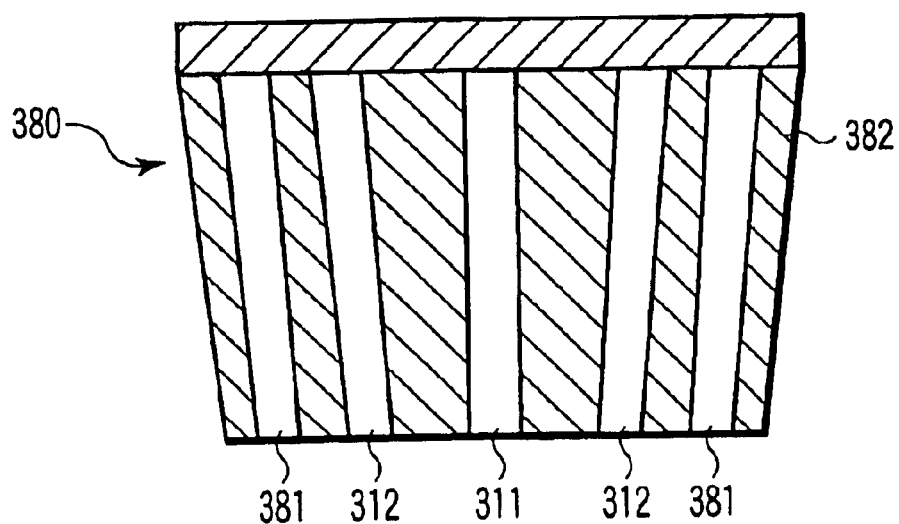

The nozzle size, shape and treating condition are limited to the embodiment. For example, the solution discharge port may be disposed ion the center, and the periphery may be surrounded with a rectangular suction port. Alternatively, the developing nozzle 380 may be composed as shown in FIGS. 37A and 37B. A rinsing solution discharge port 381 is provided outside of the suction port 311. FIG. 37A is a plan view showing the configuration of the bottom of the developing nozzle, and FIG. 37B is a plan view showing a configuration of the developing nozzle.

Figure 38A:
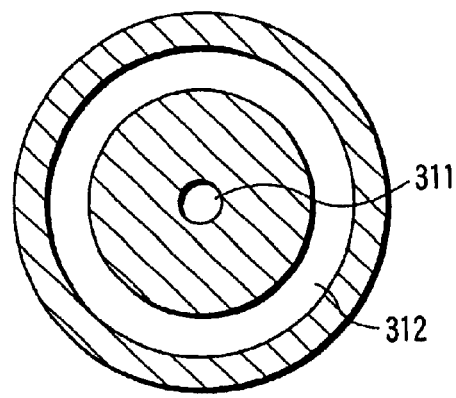
FIGS. 38A and 38B are diagrams showing a modified example of the developing nozzle according to the eighth embodiment.
Figure 38B:
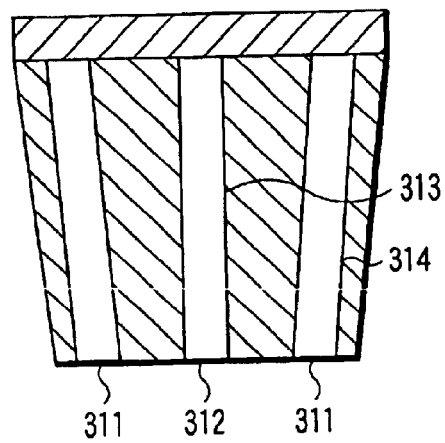

Alternatively, as shown in FIG. 38, the developing solution discharge port 311 may be disposed around the suction port 312. FIG. 38A is a plan view showing the configuration of the bottom of the developing nozzle, and FIG. 38B is a plan view showing a configuration of the developing nozzle.

Outside of the nozzle suction port, the rinsing solution is not always required to be present as in the embodiment, but other liquid may be present outside of the nozzle suction port, or instead of liquid, a gas may be present. In such a case, to prevent the developing solution from leaking outside of the developing solution suction port, or to prevent from sucking outside air such as atmosphere, it is required to keep balance of the developing solution discharge pressure and developing solution suction pressure.

As for the treating condition, it may be required to vary depending on the surface state of the material to be treated to obtained a desired flow speed, the wettability of the treating liquid or diameter or material of the nozzle, and the values are not limited to those shown in the embodiment. If the pattern size is different, the method of the embodiment also includes the selection of optimum scan speed for finishing to a desired dimension by preliminarily acquiring the covering rate and the scan speed depending on each pattern size. The treating region is either the whole area of the wafer to be treated or part of the area.

Ninth Embodiment

Figure 39:
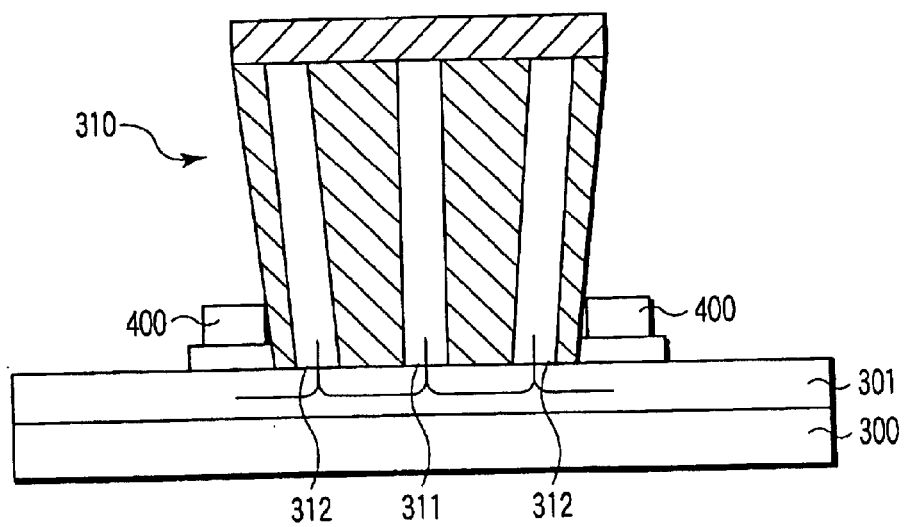
FIG. 39 is a diagram showing a configuration of a developing nozzle of a developing apparatus according to a ninth embodiment of the invention.

FIG. 39 is a diagram showing a configuration of a developing nozzle in a developing apparatus according to a ninth embodiment of the invention. Same parts as in FIG. 30 are identified with same reference numerals, and the explanation is omitted.

A reflective optical monitor 400 is attached to the side of this developing nozzle 310. The measured value of the reflective optical monitor 400 is put into the control system 318. The control system 318 calculates the gap between the top of the substrate and the bottom of the nozzle from the measured value. In this embodiment, by measuring the gap between the nozzle 310 and the substrate, the flow speed of the developing solution is varied. The other configuration is same as in the eighth embodiment and explanation is omitted.

Figure 40:
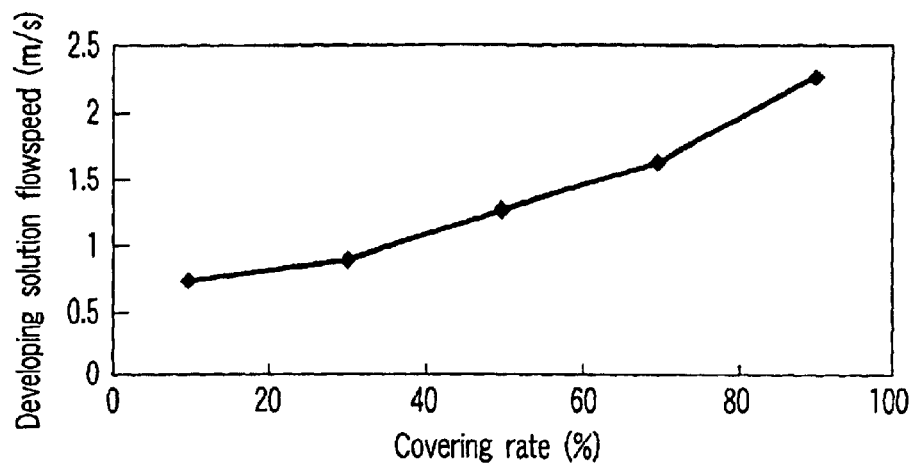
FIG. 40 is a diagram showing the relation between a covering rate and a flow speed of developing solution according to the ninth embodiment.

In the treating condition of the eighth embodiment, the average flow speed of the treating liquid is 0.1 (mm)×4π× v(mm/sec)=0.1/50 (liters/sec), and is about 1.7 msec. FIG. 40 shows the relation between the covering rate and the flow speed of the developing solution.

In a specified developing time (scan speed: 1 mm/sec), in order to finish the patterns with different covering rates in the same dimension, the flow speed must be increased where the covering rate is large. To the contrary, where the covering rate is small, the flow speed is not required to be so high. By moving the developing nozzle 310 to the scan start point, discharge of the developing solution, suction of the developing solution, and discharge of the rinsing solution were executed. The condition was controlled while varying the gap between the nozzle and the substrate so that the flow speed of developing solution conforms to the optimum flow speed suited to the covering rate of the substrate. The relation between the covering rate and the optimum flow speed is shown in FIG. 40. More specifically, FIG. 41 shows the flow speed of the developing solution in relation to the treating time.

Figure 41:
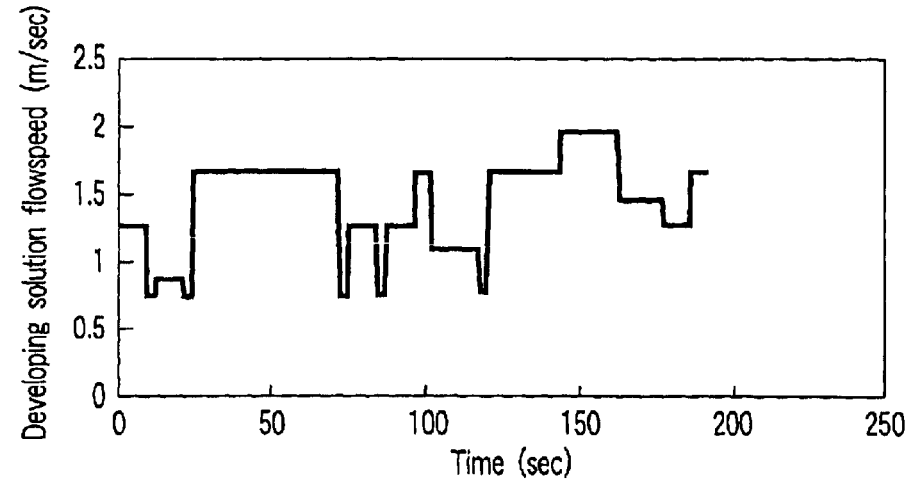
FIG. 41 is a diagram showing a flow speed of developing solution in relation to treating time according to the ninth embodiment.

On the basis of the relation shown in FIG. 41, development is performed same as in the chip of the covering rate in the eighth embodiment.

After terminating the developing process, the wafer was rotated to shake off the rinsing solution on the wafer to dry, and formation of the resist pattern was finished.

Control of the flow speed is not limited to the gap, but it may be controlled also by the discharge speed of the developing solution and suction speed of the developing solution.

Tenth Embodiment

Surface treatment conducted in a preceding stage of development of the resist film is explained.

After exposure, before developing the resist on a specified baked wafer, it is oxidized. Since the wettability to the developing solution differs between the exposed area and the unexposed area, after developing process, strictly, the flow speed of the developing solution varies between the exposed area and the unexposed area. The oxidation process is intended to equalize and improve the wettability to the developing solution on the resist surface in the entire area of the substrate. Ozone water was used in the oxidation process.

Figure 42:
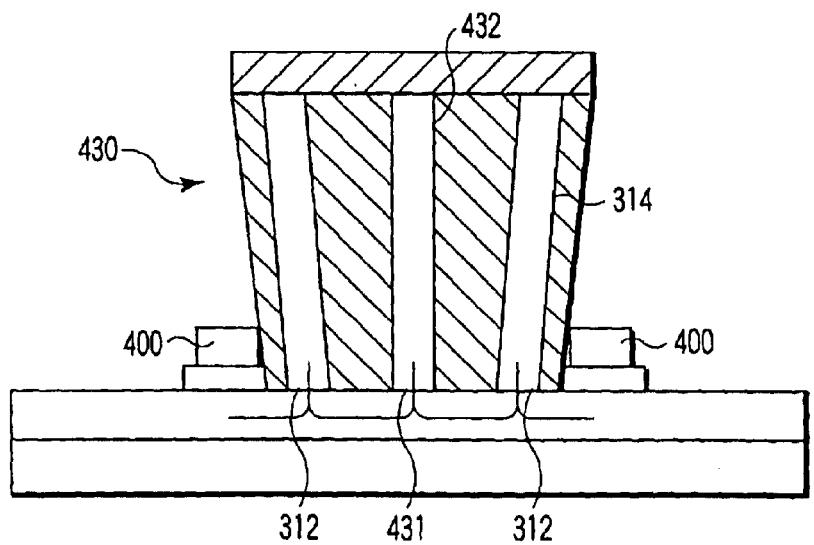
FIG. 42 is a diagram showing a configuration of a treating nozzle of a substrate surface treating apparatus according to a tenth embodiment of the invention.

FIG. 42 shows a configuration of a treating nozzle of a substrate surface treating apparatus according to the tenth embodiment. Same parts as in FIG. 29 are identified with same reference numerals, and the explanation is omitted. As shown in FIG. 42, the treating nozzle 430 has an ozone water supply nozzle 432. The ozone water supply nozzle 432 has an ozone water discharge port 431 at a side facing the substrate 300. Ozone water supplied from a supply/suction system (not shown) is discharged from the ozone water discharge port 431 onto the substrate 300.

Oxidation process is explained. Concentration of ozone water used in the oxidation treatment of the resist surface was 3 ppm. The chip having the same covering rate as in the eighth embodiment is oxidized. Same as in the eighth embodiment, oxidation is processed in the relation of the treating time and scan speed shown in FIG. 35. During oxidation treatment, it is treated so that the gap between the bottom of the treating nozzle 430 and the top of the substrate 300 is a constant value depending on the measured value by an reflective optical monitor.

After oxidation process, the resist film is developed. Then, after rinsing the substrate by supplying a rinsing solution, the substrate was rotated to shake off the liquid on the substrate to dry the substrate. Thus, formation of the resist pattern is terminated.

Before and after the ozone water treatment, the contact angle of the developing solution on the resist film was measured, and the wettability was evaluated. The contact angle was 60 degrees before treatment, and was improved to 54 degrees after treatment. It was confirmed that the wettability to the developing solution of the resist film was improved by ozone water treatment. By improvement of wettability, the developing solution can flow on the substrate at a very high speed. As a result, replacement effect of development barrier between patterns at the time of development is improved, and the dimensional difference due to density or sparsity can be decreased to ±4 nm.

Means for varying the treating time is not limited to the relative speed of the substrate and nozzle alone. For example, by changing the concentration or temperature of the treating solution or the flow speed of the treating solution, the treating time can be varied substantially. This method is not limited to treatment of the entire region on the substrate. Only the exposed area or only the unexposed area may be treated. Surface treatment of the substrate is not limited to the process by using oxidizing liquid. Treatment by oxidizing liquid may be followed by treatment by reducing liquid, or it may be treated by using an acidic or alkaline liquid of a very low concentration.

Eleventh Embodiment

This embodiment explains a cleaning application for removing residual resist or foreign deposits from the mask.

Figure 43:
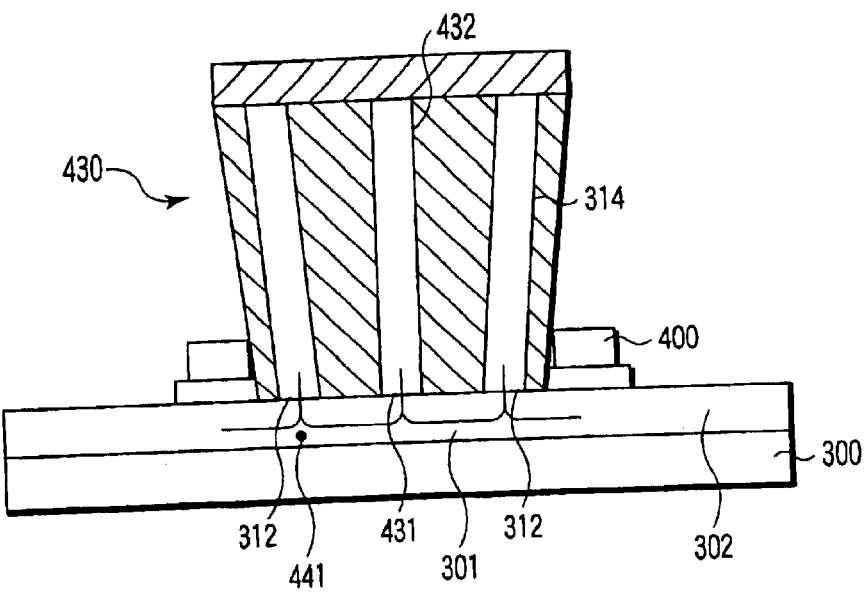
FIG. 43 is a diagram showing a configuration of a treating nozzle of a treating apparatus according to an 5 eleventh embodiment of the invention.

FIG. 43 is a diagram showing a configuration of a treating nozzle of a treating device according to the eleventh embodiment of the invention. The treating nozzle 430 used in this process is same as the nozzle explained in the tenth embodiment, and detailed description is omitted. As cleaning solution, ozone water of concentration of 20 ppm is used.

Actual treatment will be explained.

Defects are inspected on a 6-inch mask substrate after forming a resist pattern, and position of a foreign matter 441 on the mask such as residual resist or dust particle is detected preliminarily.

After setting the mask on the substrate support stand, the nozzle is moved above the defect coordinates position as shown in FIG. 15. The gap between the bottom of the treating nozzle 430 and the top of the substrate 300 is set at 50 $\mu$m. Ozone water is discharged from the ozone water discharge port 431, and is simultaneously sucked from the suction port 312. Fixing the position of the treating nozzle 430, ozone water is discharged and sucked for 10 seconds, and discharge and suction action of ozone water is stopped. After treatment, the nozzle is moved away to the waiting position.

During treatment, the gap is controlled at 50 $\mu$m measuring by a reflective optical monitor. By the gap control, the average flow speed of the cleaning solution was set at 10 cm/sec or more.

After treatment, the rinsing solution is supplied on the substrate 300 to rinse, and the substrate is rotated to shake off liquid from the substrate, and cleaning of the substrate is over.

By the method of the embodiment, all organic deposits on the substrate can be successfully removed.

According to the experiment by the inventors, at a flow speed of the cleaning solution of 10 cm/sec or more, it was confirmed that all organic deposits could be completely removed. Hence, the flow speed of the cleaning solution is preferred to be 10 cm/sec or more. To realize the average flow speed of the cleaning solution at 10 cm/sec, the gap, discharge speed of the cleaning solution or suction speed of the cleaning solution can be selected as desired. Alternatively, it may be realized intentionally by applying pressure to the liquid by means of a pump or the like.

Not only on the resist pattern, this process is also effective for removing organic deposits on the chrome mask or halftone mask after resist stripping.

Twelfth Embodiment

This embodiment explains a cleaning application for removing residual resist or foreign deposits from the mask.

Figure 44:
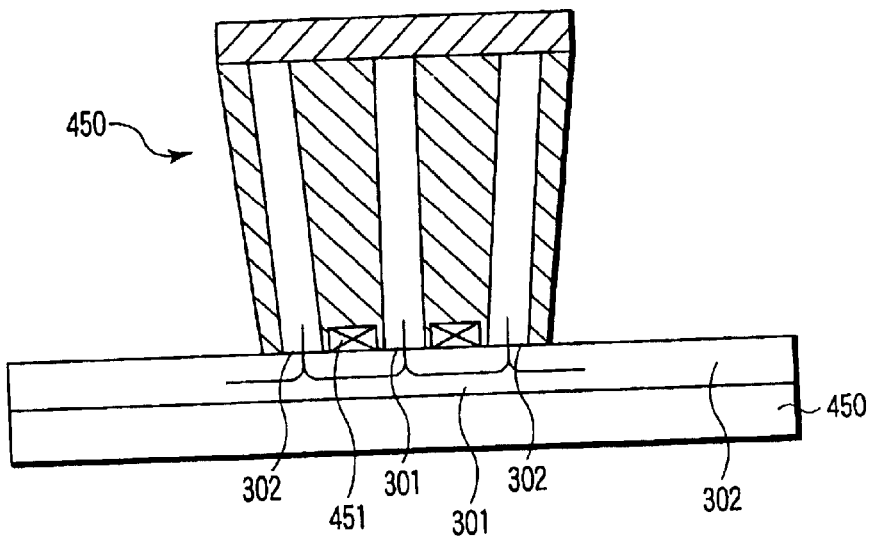
FIG. 44 is a diagram showing a configuration of a treating nozzle of a treating apparatus according to a twelfth embodiment of the invention.

FIG. 44 is as diagram showing a configuration of a developing nozzle of a developing apparatus according to the twelfth embodiment of the invention. In FIG. 44, same parts as in FIG. 29 are identified with same reference numerals, and detailed description is omitted.

Figure 45:
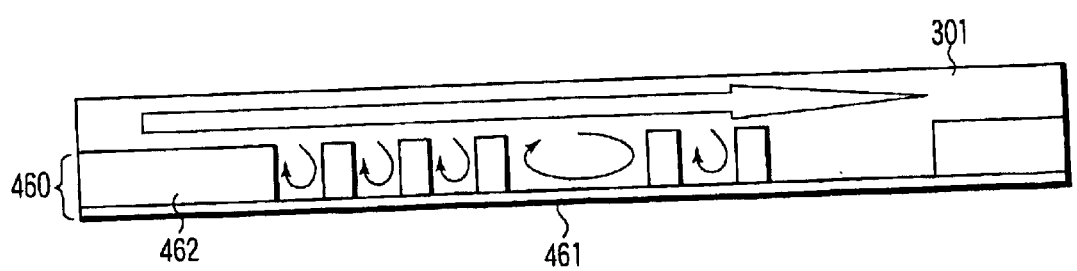
FIG. 45 is a diagram explaining the action and effect of the developing apparatus according to the twelfth embodiment.

This developing nozzle 450 has an ultrasonic vibrator 451 at its lower side. As the ultrasonic vibrator 451 operates during developing process, vibrations are applied to the developing solution 301 existing between the bottom of the developing nozzle 450 and the substrate 300. By pulsation of the developing solution, as shown in FIG. 45, the developing solution 301 between resist patterns 462 on a wafer 461 can be replaced efficiently. As a result, a desired pattern dimension is obtained.

If attempted to develop only by the developing solution at a specific flow speed by bringing the developing nozzle close to the substrate surface, it is very hard to finish patterns of different covering rates simultaneously to a desired dimension by the developing process alone. This is because the replacement efficiency of the developing solution between patterns it not enough. By giving ultrasonic vibrations to the developing solution on the patterns with different covering rates can be simultaneously finished to a desired dimension.

Not limited to this method of application of ultrasonic vibration to the developing solution on the substrate, the replacement efficiency can be also enhanced by varying the flow speed of the developing solution in terms of time. Same effects are obtained by varying at least one of the relative moving speed between the developing nozzle and the substrate and the interval between the solution discharge/suction unit and the substrate surface in terms of time.

Also, by installing the ultrasonic vibrator in the scan nozzle of the developing apparatus shown in FIG. 12 to FIG. 14, shaking motions can be applied to the developing solution on the substrate. Same effects are obtained by varying at least one of the flow speed of the developing solution, relative moving speed between the developing nozzle and the substrate, and interval between the solution discharge/suction unit and the substrate surface in terms of time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate treating method comprising discharging a solution continuously to a substrate to be treated from a solution discharge port of a solution discharge/suction unit, sucking the solution on the substrate continuously from two suction ports disposed in the solution discharge/suction unit so as to enclose the solution discharge port, and treating the substrate surface with the solution while moving the solution discharge/suction unit and the substrate relatively in a horizontal linear motion, wherein the flow speed of the solution flowing between the substrate and the solution discharge/suction unit is faster than the relative moving speed between the solution discharge/suction unit and the substrate.

2. A substrate treating method comprising discharging a solution continuously to a substrate to be treated from a solution discharge port of a solution discharge/suction unit, sucking the solution on the substrate continuously from two suction ports disposed in the solution discharge/suction unit so as to enclose the solution discharge port, and treating the substrate surface with the solution while moving the solution discharge/suction unit and the substrate relatively in a horizontal linear motion, wherein the interval between the substrate and the bottom of the solution discharge/suction unit is in a range of 0.01 mm or more and 0.5 mm or less.

3. A substrate treating method comprising discharging a solution continuously to a substrate to be treated from a solution discharge port of a solution discharge/suction unit, sucking the solution on the substrate continuously from two suction ports disposed in the solution discharge/suction unit so as to enclose the solution discharge port, and treating the substrate surface with the solution while moving the solution discharge/suction unit and the substrate relatively in a horizontal linear motion, wherein the average flow speed of the solution flowing between the substrate and the solution discharge/suction unit is 0.02 m/sec or more.

4. A substrate treating method comprising discharging a solution continuously to a substrate to be treated from a solution discharge port of a solution discharge/suction unit, sucking the solution on the substrate continuously from two suction ports disposed in the solution discharge/suction unit so as to enclose the solution discharge port, and treating the substrate surface with the solution while moving the solution discharge/suction unit and the substrate relatively in a horizontal linear motion, wherein the flow speed of the solution flowing between the substrate and the solution discharge/suction unit is varied in terms of time.

5. A substrate treating method comprising discharging a solution continuously to a substrate from a solution discharge port of a solution discharge/suction unit, sucking the solution on the substrate continuously from two suction ports disposed in the solution discharge/suction unit so as to enclose the solution discharge port, and treating the substrate surface with the solution while moving the solution discharge/suction unit and the substrate relatively in a horizontal linear motion, wherein at least one of the relative moving speed between the substrate and the solution discharge/suction unit and the interval between the solution discharge/suction unit and the top of the substrate is varied in terms of time.

6. A method of manufacturing a semiconductor device by using a substrate treating method according to claim 1.

7. A method of manufacturing a semiconductor device by using a substrate treating method according to claim 2.

8. A method of manufacturing a semiconductor device by using a substrate treating method according to claim 3.

9. A method of manufacturing a semiconductor device by using a substrate treating method according to claim 4.

10. A method of manufacturing a semiconductor device by using a substrate treating method according to claim 5.

* * * * *